(12) United States Patent
Sawachi

(10) Patent No.: US 8,123,131 B2
(45) Date of Patent: Feb. 28, 2012

(54) ANTENNA CONTAINING SUBSTRATE

(75) Inventor: Youichi Sawachi, Asaka (JP)

(73) Assignee: FUJIFILM Corporation, Tokyo (JP)

( * ) Notice: Subject to any disclaimer, the term of this patent is extended or adjusted under 35 U.S.C. 154(b) by 976 days.

(21) Appl. No.: 11/785,338

(22) Filed: Apr. 17, 2007

(65) Prior Publication Data
US 2007/0241200 A1 Oct. 18, 2007

(30) Foreign Application Priority Data

Apr. 17, 2006 (JP) ................................. 2006-112836
Feb. 23, 2007 (JP) ................................. 2007-043069

(51) Int. Cl.
*G06K 7/08* (2006.01)
(52) U.S. Cl. ........................................................ 235/451
(58) Field of Classification Search ................... 235/451
See application file for complete search history.

(56) References Cited

U.S. PATENT DOCUMENTS

| | | | | |
|---|---|---|---|---|
| 5,796,362 | A * | 8/1998 | Ayasli et al. | 342/6 |
| 5,854,480 | A * | 12/1998 | Noto | 235/492 |
| 6,825,751 | B1 * | 11/2004 | Kita et al. | 340/5.61 |
| 2003/0234294 | A1 * | 12/2003 | Uchihiro et al. | 235/492 |
| 2004/0183733 | A1 * | 9/2004 | Aoyama et al. | 343/702 |
| 2004/0214532 | A1 * | 10/2004 | Azuma | 455/101 |
| 2005/0130389 | A1 * | 6/2005 | Yamazaki et al. | 438/455 |
| 2005/0173532 | A1 * | 8/2005 | Hasebe et al. | 235/451 |
| 2008/0106469 | A1 * | 5/2008 | Kikkawa et al. | 343/700 MS |
| 2008/0280648 | A1 * | 11/2008 | Miyagawa et al. | 455/558 |

FOREIGN PATENT DOCUMENTS

| | | | |
|---|---|---|---|
| JP | 5-135834 | A | 6/1993 |
| JP | 7-7238 | A | 1/1995 |
| JP | 2000-90221 | A | 3/2000 |
| JP | 2001-352208 | A | 12/2001 |
| JP | 2003-331953 | A | 11/2003 |
| JP | 2004295378 | A * | 10/2004 |
| JP | 2005224868 | A * | 8/2005 |
| JP | 2006-13901 | A | 1/2006 |
| JP | 2006-72804 | A | 3/2006 |

OTHER PUBLICATIONS

Japanese Office Action 2007-043069 dated Feb. 1, 2011, 7 pages in English and Japanese.

* cited by examiner

*Primary Examiner* — Michael G Lee
*Assistant Examiner* — David Tardif
(74) *Attorney, Agent, or Firm* — Sughrue Mion, PLLC

(57) ABSTRACT

To increase an area in which a component can be mounted in a substrate including an IC chip to which an antenna is connected. For this purpose, an opening at the center of a center substrate is provided with an IC chip. An antenna is wired to an upper surface of the center substrate so as to enclose the IC chip. A top substrate is laminated and fixed on the upper surface of the center substrate. A bottom substrate is laminated and fixed on a lower surface of the center substrate. Since the antenna is not wired to an upper surface of the top substrate and a lower surface of the bottom substrate, a component can be mounted on the entire upper and lower surfaces. This allows a large number of components to be mounted.

8 Claims, 21 Drawing Sheets

ANTENNA CONTAINING SUBSTRATE

BACKGROUND OF THE INVENTION

1. Field of the Invention

The present invention relates to an antenna-containing substrate, an antenna-containing substrate carrying device, an operation member/antenna mounting substrate carrying device, a digital still camera, and controlling methods therefor.

2. Description of the Background Art

In electronic devices such as digital still cameras, a plurality of circuit boards may, in some cases, be used. For this purpose, the plurality of circuit boards are wired and electrically connected to one another. Various contrivances have been made in order to electrically connect the plurality of circuit boards (see JP-A-5-135834, JP-A-7-7238, and JP-A-2003-331953).

However, it is not well considered that a large number of mounting components can be arranged on a circuit board. When the circuit boards are wired to one another, the process of wiring processing is required. Therefore, the electronic device can be increased in size by ensuring a wiring space, and the mounting components can be separated by shock.

SUMMARY OF THE INVENTION

An object of the present invention is to arrange a large number of mounting components on a circuit board.

Another object of the present invention is to allow a signal to be transmitted and received without wiring a plurality of substrates to one another.

An antenna-containing substrate according to a first invention is characterized in that a first substrate is provided with an IC chip, and has an antenna, connected to the IC chip, mounted on its surface, and the first substrate and a second substrate are fixed and laminated such that a reverse surface of the second substrate is opposed to the surface of the first substrate.

According to the first invention, the antenna is mounted on the surface of the first substrate. The first substrate and the second substrate are fixed and laminated such that the reverse surface of the second substrate is opposed to the surface of the first substrate. Since no antenna is provided on a reverse surface of the first substrate and a surface of the second substrate, the entire reverse surface of the first substrate and the entire surface of the second substrate can be utilized for mounting a component. This allows a large number of components to be mounted.

There may be provided a wiring pattern for electrically connecting the IC chip to a component to be mounted on at least one of a reverse surface of the first substrate and a surface of the second substrate. In this case, it is preferable that the IC chip further comprises a power supply circuit that generates the power to be supplied to the IC chip on the basis of a radio wave signal received by the antenna, a data interface circuit that establishes data communication to and from the component to be mounted, a determination circuit that determines whether the power generated by the power supply circuit is supplied to the IC chip or the power applied through the wiring pattern is supplied to the IC chip, and a power supply control circuit that controls the supply of the power so as to continue to supply the power to the data interface circuit in response to the determination by the determination circuit that the power is supplied to the IC chip through the wiring pattern, while stopping supplying the power to the data interface circuit in response to the determination by the determination circuit that the power generated by the power supply circuit is supplied to the IC chip.

The first invention also provides a method of controlling the above-mentioned antenna-containing substrate. That is, this method is a method of controlling an antenna-containing substrate in which a first substrate is provided with an IC chip, and has an antenna, connected to the IC chip, mounted on its surface, the first substrate and a second substrate are fixed and laminated such that a reverse surface of the second substrate is opposed to the surface of the first substrate, and there is provided a wiring pattern for electrically connecting the IC chip to a component to be mounted on at least one of a reverse surface of the first substrate and a surface of the second substrate, characterized in that a power supply circuit generates the power to be supplied to the IC chip on the-basis of a radio wave signal received by the antenna, a determination circuit determines whether the power generated by the power supply circuit is supplied to the IC chip or the power applied through the wiring pattern is supplied to the IC chip, and a power supply control circuit controls the supply of the power so as to continue to supply the power to a data interface circuit that establishes data communication to and from the component to be mounted in response to the determination by the determination circuit that the power is supplied to the IC chip through the wiring pattern, while stopping supplying the power to the data interface circuit in response to the determination by the determination circuit that the power generated by the power supply circuit is supplied to the IC chip.

An antenna-containing substrate carrying device according to a second invention is characterized by comprising two antenna-containing substrates each having a configuration in which a first substrate is provided with an IC chip, and has an antenna, connected to the IC chip, formed on its surface, the first substrate and a second substrate are fixed and laminated such that a reverse surface of the second substrate is opposed to the surface of the first substrate, and a fixing member that fixes the two antenna-containing substrates such that the one antenna constituting one of the antenna-containing substrates is opposed to the other antenna constituting the other antenna-containing substrate.

According to the second invention, the two antenna-containing substrates are fixed to each other such that the respective antennas in the antenna-containing substrates are opposed to each other. When a signal is communicated between the antennas, the communication efficiency is improved.

The fixing member may fix the one antenna-containing substrate and the other antenna-containing substrate such that a normal to the one antenna-containing substrate and a normal to the other antenna-containing substrate are nonparallel to each other. In this case, the position and the size of the other antenna will be defined such that the other antenna has a position and a size determined when the one antenna is projected on the other antenna-containing substrate.

It is preferable that a plane pattern connected to the power or the ground is formed in a portion, excluding a portion corresponding to the first IC chip, the second IC chip, the one antenna, and the other antenna, on at least one of the opposed surfaces of the two antenna-containing substrates fixed by the fixing member. In addition, the portion, excluding the portion corresponding to the first IC chip, the second IC chip, the one antenna, and the other antenna, on at least one of the opposed surfaces of the two antenna-containing substrates fixed by the fixing member may be defined as an area in which a component is to be mounted.

An antenna-containing substrate carrying device according to a third invention is characterized by comprising three antenna-containing substrates each having a configuration in which a first substrate is provided with an IC chip, and has an antenna, connected to the IC chip, formed on its surface, and the first substrate and a second substrate are fixed and laminated such that a reverse surface of the second substrate is opposed to the surface of the first substrate, and in that the IC chip provided in each of the three antenna-containing substrates comprises a demodulation circuit that demodulates a signal received in the antenna, modulation frequencies used for modulating the signal that can be demodulated by the demodulation circuit being of two types, at least one of the three antenna-containing substrates comprises a modulation circuit that varies the modulation frequency, and the IC chip further comprises a transmission control circuit that transmits the signal modulated by the modulation circuit by means of the antenna.

The third invention also provides a controlling method suitable for the above-mentioned antenna-containing substrate carrying device. That is, this method is a method of controlling an antenna-containing substrate carrying device comprising three antenna-containing substrates each having a configuration in which a first substrate is provided with an IC chip, and has an antenna, connected to the IC chip, formed on its surface, and the first substrate and a second substrate are fixed and laminated such that a reverse surface of the second substrate is opposed to the surface of the first substrate, characterized in that the IC chip provided in each of the three antenna-containing substrates comprises a demodulation circuit that demodulates a signal received in the antenna, modulation frequencies used for modulating the signal that can be demodulated by the demodulation circuit being of two types, at least one of the three antenna-containing substrates comprises a modulation circuit that varies the modulation frequency, and the IC chip further comprises a transmission control circuit that transmits the signal modulated by the modulation circuit by means of the antenna.

According to the third invention, each of the three antenna-containing substrates is provided with the demodulation circuit that demodulates the signal received in the antenna. The modulation frequencies used for modulating the signal that can be demodulated by the demodulation circuit are of two types. At least one of the three antenna-containing substrates is provided with the modulation circuit that varies the modulation frequency. The transmission control circuit transmits the signal modulated using the modulation frequency that can be demodulated by the demodulation circuit provided in the antenna-containing substrate to which the signal is to be transmitted, so that only the demodulation circuit in the antenna-containing substrate can demodulate the modulated signal. This can prevent radio interference.

The transmission-side antenna-containing substrate that transmits the modulated signal from the transmission control circuit may comprise a first transmission circuit that transmits a request to transmit an identification code to the other antenna-containing substrate. In this case, the other antenna-containing substrate comprises a second transmission circuit that transmits the identification code and data representing the modulation frequency that can be demodulated by the demodulation circuit to the transmission-side antenna-containing substrate in response to the transmission request from the first transmission circuit. The transmission-side antenna-containing substrate will comprise a control circuit that controls the transmission control circuit that has received the identification code and the modulation frequency data transmitted from the second transmission circuit, to transmit the modulated signal to the other antenna-containing substrate using the modulation frequency represented by the modulation frequency data.

An operation member/antenna mounting substrate carrying device according to a fourth invention is characterized by comprising an operation member mounting substrate having an operation member mounted on its surface, being provided with an IC chip connected to the operation member, and having a first antenna, connected to the IC chip, mounted on its surface or reverse surface, and a communication substrate having a second antenna, communicating with the first antenna mounted on the operation member mounting substrate, mounted thereon.

An operating state in the operation member mounted on the operation member mounting substrate can be transmitted to the antenna mounting substrate. Since the operation member mounting substrate and the antenna mounting substrate are not connected to each other by wiring, the operation member/antenna mounting substrate carrying device relatively withstand shock.

The operation member mounting substrate may be fixed to a case of the operation member/antenna mounting substrate carrying device on which the operation member mounting substrate is mounted with the substrate positioned inside the case and the operation member positioned so as to be exposed to the outside of the case.

The operation member mounting substrate may be integrated with the case by being molded thereto. Further, the operation member mounting substrate may be a flexible substrate.

It is preferable that a portion, corresponding to a portion having the first antenna mounted thereon, on a surface of the operation member mounting substrate is electromagnetically shielded.

The operation member/antenna mounting substrate carrying device may further comprise a transmission control circuit that transmits a radio wave signal for generating the power from the second antenna mounted on the communication substrate to the first antenna mounted on the operation member mounting substrate. In this case, the IC chip provided in the operation member mounting substrate will further comprise a power supply circuit that generates the power on the basis of the radio wave signal received in the first antenna, a detection circuit that detects an operating state in the operation member on the basis of the power generated by the power supply circuit, and a transmission control circuit that transmits a signal representing the operating state detected by the detection circuit from the first antenna to the second antenna mounted on the communication substrate by means of the first antenna.

The communication substrate may further comprises a determination circuit that determines whether or not it does not communicate with an external device excluding the operation member/antenna mounting substrate carrying device by means of the first antenna mounted on the operation member mounting substrate, and a communication control circuit that establishes communication through the first antenna mounted on the operation member mounting substrate by means of the second antenna in response to the determination by the determination circuit that it does not communicate with the external device.

The operation member mounting substrate may further comprise a receiving control circuit that carries out control such that the first antenna mounted on the operation member mounting substrate receives data transmitted from the external device excluding the operation member/antenna mounting substrate carrying device, and a memory circuit that stores the data received in the receiving control circuit.

The communication substrate may further comprise a receiving control circuit that carries out control such that the second antenna mounted on the communication substrate receives the data transmitted from the external device excluding the operation member/antenna mounting substrate carrying device, and a memory circuit that stores the data received in the receiving control circuit.

The fourth invention also provides a controlling method suitable for the above-mentioned operation member/antenna mounting substrate carrying device. That is, this method is a method of controlling an operation member/antenna mounting substrate carrying device comprising an operation member mounting substrate having an operation member mounted on its surface, being provided with an IC chip connected to the operation member, and having a first antenna, connected to the IC chip, mounted on its surface or reverse surface, and a communication substrate having a second antenna, communicating with the first antenna mounted on the operation member mounting substrate, mounted thereon, characterized in that a first transmission control circuit transmits a radio wave signal for generating the power from the second antenna to the first antenna, a power supply circuit included in the IC chip provided in the operation member mounting substrate generates the power on the basis of the radio wave signal received in the first antenna, a detection circuit detects an operating state in the operation member on the basis of the power generated by the power supply circuit, and a second transmission control circuit transmits a signal representing the operating state detected by the detection circuit to the second antenna from the first antenna by means of the first antenna.

A fifth invention provides a digital still camera that images a subject and outputs an image signal representing a subject image, characterized by comprising a memory circuit that stores at least one of image data obtained by the imaging and imaging condition data representing imaging conditions, an antenna for transmitting and receiving a signal, a power supply circuit that generates the power when a radio wave signal for generating the power is fed to the antenna, and a transmission control circuit that is driven on the basis of the power generated by the power supply circuit, to transmit at least one of the image data and the imaging condition data stored in the memory circuit by means of the antenna.

The fifth invention also provides a controlling method suitable for the digital still camera. That is, this method is a method of controlling a digital still camera that images a subject and outputs an image signal representing a subject image, characterized in that a memory circuit stores at least one of image data obtained by the imaging and imaging condition data representing imaging conditions, a power supply circuit generates the power when a radio wave signal for generating the power is fed to an antenna, and a transmission control circuit is driven on the basis of the power generated by the power supply circuit, to transmit at least one of the image data and the imaging condition data stored in the memory circuit by means of the antenna.

According to the fifth invention, when the radio wave signal is fed to the antenna, the power is generated, and at least one of the image data and the imaging condition data stored in the memory circuit is transmitted by the generated power. Even if the main power to the digital still camera is not turned on, the subject image obtained by the imaging can be seen, and the imaging conditions can be confirmed.

When the digital still camera is operated by a battery, it is preferable that it further comprises a detection circuit that detects the remaining capacity of the battery and the remaining capacity of the memory circuit. In this case, the memory circuit further stores the respective remaining capacity of the battery and the remaining capacity of the memory circuit that are detected by the detection circuit. The transmission control circuit will further transmit signals respectively representing the remaining capacity of the battery and the remaining capacity of the memory circuit to the external device.

The digital still camera may further comprise an abnormality detection circuit that detects an abnormality in the digital still camera, a memory circuit that stores an error signal representing the contents of the abnormality detected by the abnormality detection circuit, an antenna for transmitting and receiving a signal, a power supply circuit that generates the power when a radio wave signal for generating the power is fed to the antenna, and a transmission control circuit that is driven on the basis of the power generated by the power supply circuit, to transmit the error signal stored in the memory circuit by means of the antenna.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
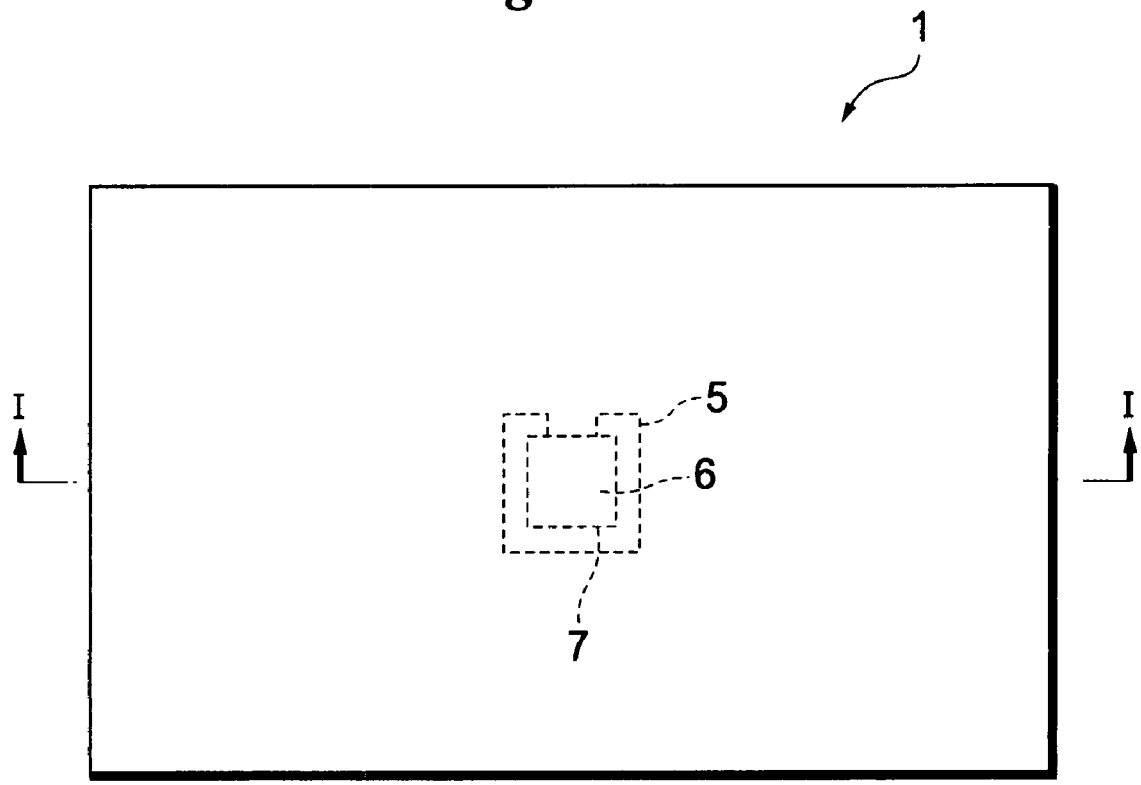
FIG. 1A is a plan view of an antenna-containing substrate.
Figure 1B:
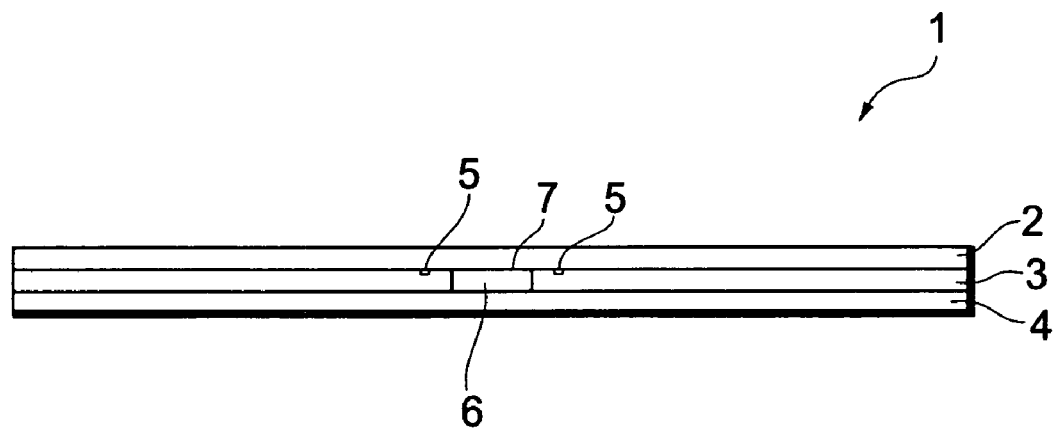
FIG. 1B is a cross-sectional view taken along a line I-I shown in FIG. 1A.

FIG. 1A and FIG. 1B illustrate an embodiment of the present invention, showing an antenna-containing substrate. FIG. 1A is a plan view of the antenna-containing substrate, and FIG. 1B is a cross-sectional view of the antenna-containing substrate. In order to make the following description understandable, hatching in a cross section is omitted.

An antenna-containing substrate 1 comprises three layers of substrates 2, 3, and 4. A substrate (a top substrate) 2 is fixed on an upper surface of a substrate at the center (a center substrate) 3, and a substrate (a bottom substrate) 4 is fixed on a lower surface of the center substrate 3.

A substantially square opening 7 is formed in a central portion of the center substrate 3. An IC chip 6 is fitted in the opening 7 such that its upper and lower surfaces are exposed (may not be exposed) from the center substrate 3. An antenna 5 having conductive properties such as copper is connected to the IC chip 6. The antenna 5 is wired to the upper surface of the center substrate 3 so as to enclose the IC chip 6. The top substrate 2 is laminated on the center substrate 3 so as to cover the upper surface of the IC chip 6 and an upper surface of the antenna 5. Further, the bottom substrate 4 is laminated on the center substrate 3 so as to cover the lower surface of the IC chip 6.

Since neither the IC chip 6 nor the antenna 5 is exposed to an upper surface of the antenna-containing substrate 1 (an upper surface of the top substrate 2) and a lower surface of the antenna-containing substrate 1 (a lower surface of the bottom substrate 4), an area in which a component to be connected to the IC chip 6 through a wiring pattern can be mounted is widened on the upper surface and the lower surface of the antenna-containing substrate 1. A large number of components can be mounted on the upper surface and the lower surface of the antenna-containing substrate 1.

Although in the above-mentioned embodiment, the antenna-containing substrate 1 has a three-layer structure in which the substrates 2 and 4 are provided above and below the center substrate 3, it may have a two-layer structure in which a substrate is laminated above or below a center substrate 3.

Figure 2:
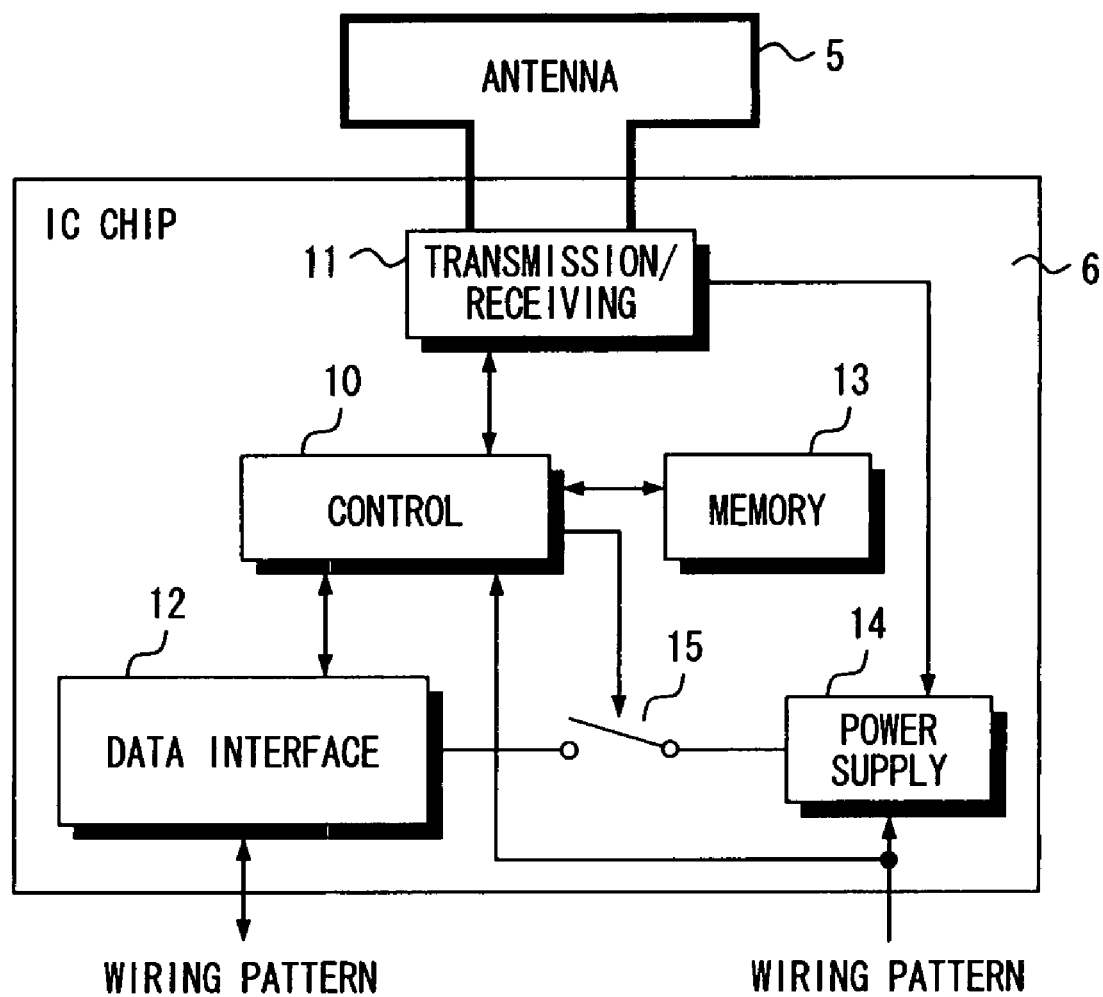
FIG. 2 is a block diagram showing the electrical configuration of an IC chip.

FIG. 2 is a block diagram showing the electrical configuration of the IC chip 6.

The operation of the IC chip 6 is supervised by a control circuit 10 containing a microprocessor or the like. A memory 13 is connected to the control circuit 10. A nonvolatile memory, for example, can be utilized as the memory 13. The memory 13 stores data such as a transmission frequency, a receiving frequency, a substrate version, a substrate type, a serial number, carried component information, substrate destination information, a software version, and adjustment information in addition to an operation program. The information and others are stored in the memory 13, so that the antenna-containing substrate 1 has the same function as an IC tag. Therefore, substrate information is available from external equipment or the like.

The IC chip 6 includes a data interface 12 connected to the wiring pattern formed in the antenna-containing substrate 1. The data interface 12 is a circuit for inputting and outputting data between the component mounted on the antenna-containing substrate 1, as described above, and the control circuit 10. The power is also supplied to the data interface 12 through the wiring pattern. The power supplied through the wiring pattern is also applied to the control circuit 10. The control circuit 10 detects whether or not the power is supplied from the wiring pattern.

The above-mentioned antenna 5 is connected to a transmission/receiving circuit 11. The control circuit 10 applies to the transmission/receiving circuit 11 the data inputted to the data interface circuit 12. The data is modulated in the transmission/receiving circuit 11, and is transmitted from the antenna 5. Further, a radio wave signal received in the antenna 5 is demodulated in the transmission/receiving circuit 11. The control circuit 10 applies data obtained by the demodulation to the component mounted on the antenna-containing substrate 1 through the data interface circuit 12. The frequency band of the radio wave signal transmitted and received by the antenna 5 may be any of a low frequency (LF), a medium frequency (MF), a high frequency (HF), a very high frequency (VHF), a ultrahigh frequency (UHF), a microwave (MW), and a millimetric wave (MMW). It is suitably set in consideration of the progressive properties of a radio wave, the amount of information to be transmitted, and so on.

The radio wave signal received in the antenna 5 is also inputted to a power supply circuit 14 through the transmission/receiving circuit 11. The radio wave signal is rectified in the power supply circuit 14, to generate the power. A switch 15 that is subjected to on-off control by the control circuit 10 is provided between the power supply circuit 14 and the data interface circuit 12. The switch 15 is turned on when the power is supplied to the IC chip 6 from the wiring pattern, while being turned off when the power is not supplied to the IC chip 6 from the wiring pattern, for example. Consequently, the power generated by the power supply circuit 14 is applied to the data interface circuit 12 when the power is supplied to the data interface circuit 12 from the wiring pattern, while not being applied to the data interface circuit 12 when the power is not supplied to the data interface circuit 12 from the wiring pattern. The data interface circuit 12 is operated using the power supplied from the wiring pattern when the power is supplied to the data interface circuit 12 from the wiring pattern, while being operated using the power generated on the basis of the radio wave signal received in the antenna 5 when the power is not supplied to the data interface circuit 12 from the wiring pattern.

Figure 3:
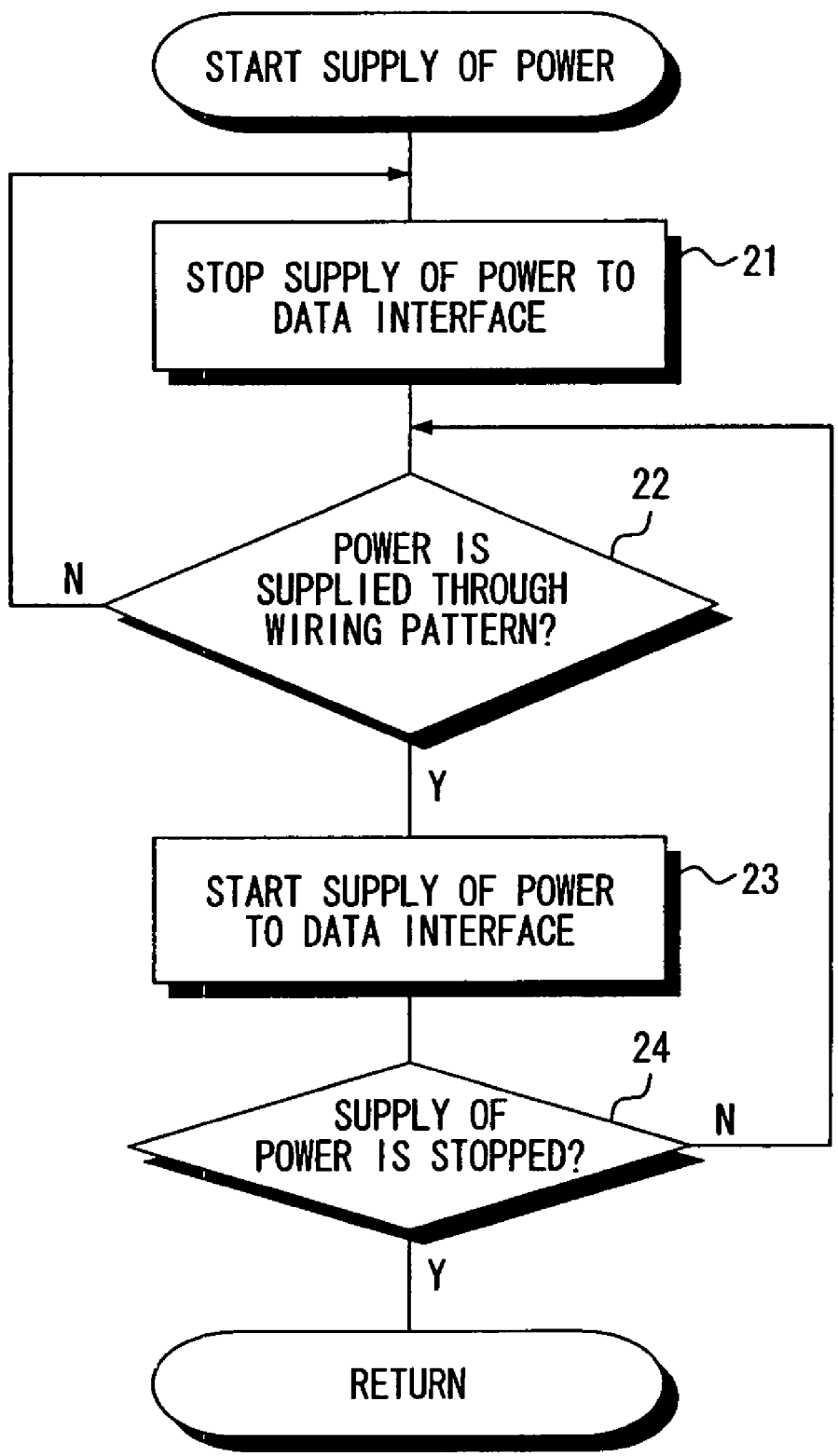
FIG. 3 is a flow chart showing the procedure for processing of an antenna-containing substrate.

FIG. 3 is a flow chart showing the procedure for power supply processing to the data interface circuit 12 in the procedure for processing of the IC chip 6 contained in the antenna-containing substrate 1.

The power supply processing is for supplying the power to the data interface circuit 12 when the power is supplied to the IC chip 6 through the wiring pattern, while stopping supplying the power to the data interface 12 when the power is generated on the basis of the radio wave signal received in the antenna 5, unlike the above-mentioned processing.

When the supply of the power to the IC chip 6 is started, the supply of the power to the data interface circuit 12 is first stopped (step 21). It is judged whether or not the power is supplied to the IC chip 6 through the wiring pattern (step 22).

Unless the power is supplied to the IC chip through the wiring pattern (NO in step 22), it is considered that the data is not inputted and outputted between the component mounted on the antenna-containing substrate 1 and the IC chip 6. Therefore, a state where the supply of the power to the data interface 12 for inputting and outputting the data to and from the component mounted on the antenna-containing substrate 1 is maintained (step 21). When the power is supplied to the IC chip through the wiring pattern (YES in step 22), it is considered that the data is inputted and outputted between the component mounted on the antenna-containing substrate 1 and the IC chip 6, so that the supply of the power to the data interface 12 is started (step 23). The processing in the step 21 to the step 23 is repeated until a command to stop the supply of the power is given to the antenna-containing substrate 1 (step 24).

When it is considered that the supply of the power to the data interface circuit 12 is not required, the supply is stopped, thereby allowing power saving.

Figure 4:
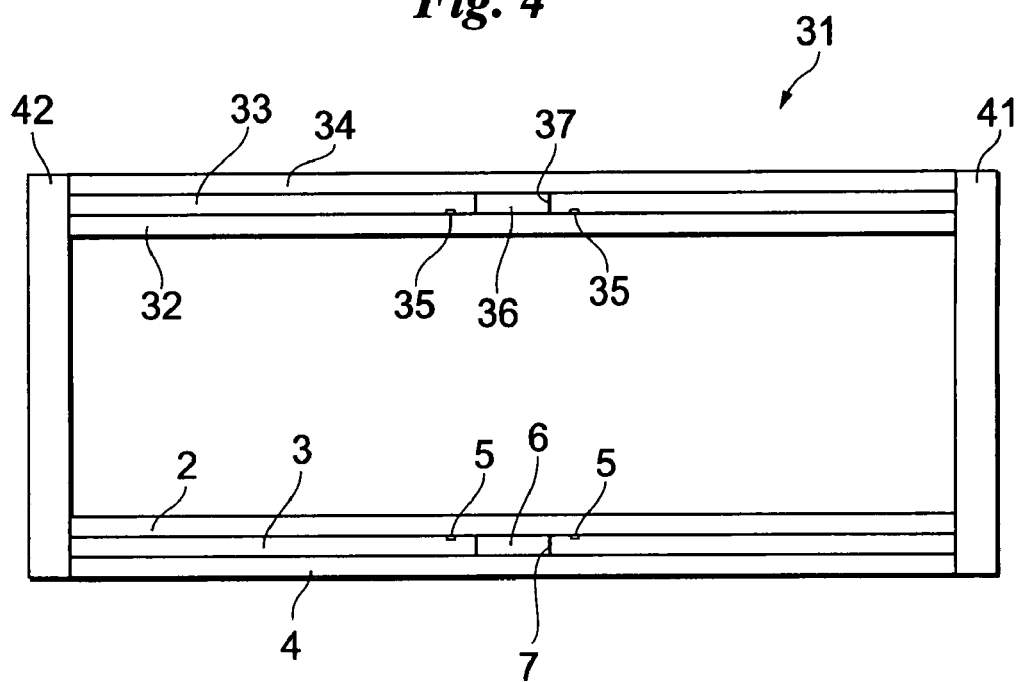
FIG. 4 and FIG. 5 are cross-sectional views of an antenna-containing substrate device.

FIG. 4 is a cross-sectional view of an antenna-containing substrate device, showing another embodiment, which corresponds to the cross-sectional view of FIG. 1B.

The antenna-containing substrate device has a first antenna-containing substrate 1 (having the same structure as that shown in FIGS. 1A and 1B, described above) and a second antenna-containing substrate 31.

The second antenna-containing substrate 31 is provided with a substantially square opening 37 in a central portion of a center substrate 33, similarly to the first antenna-containing substrate 1. An IC chip 36 is fitted in the opening 37. An antenna 35 is connected to the IC chip 36, and is wired so as to enclose the IC chip 36 on a surface (a lower surface) of the center substrate 33 in the same manner as that shown in FIG. 1A. Substrates 32 and 34 are laminated and fixed above and below the center substrate 33.

The second antenna-containing substrate 31 is in an upside-down relationship with the first antenna-containing substrate 1, and the antenna 35 is wired to the lower one of upper and lower surfaces of the center substrate 32 (it may be wired to the upper surface).

The antenna 5 in the first antenna-containing substrate 5 and the antenna 35 in the second antenna-containing substrate 31 are fixed to each other by fixing members 41 and 42 such that they are just opposed to each other and the first antenna-containing substrate 5 and the second antenna-containing substrate 31 are parallel to each other a predetermined distance apart. Since the antenna 5 and the antenna 35 are positioned so as to correspond to each other, so that the transmission efficiency of data transmitted between the antennas 5 and 35 is improved.

Figure 5:
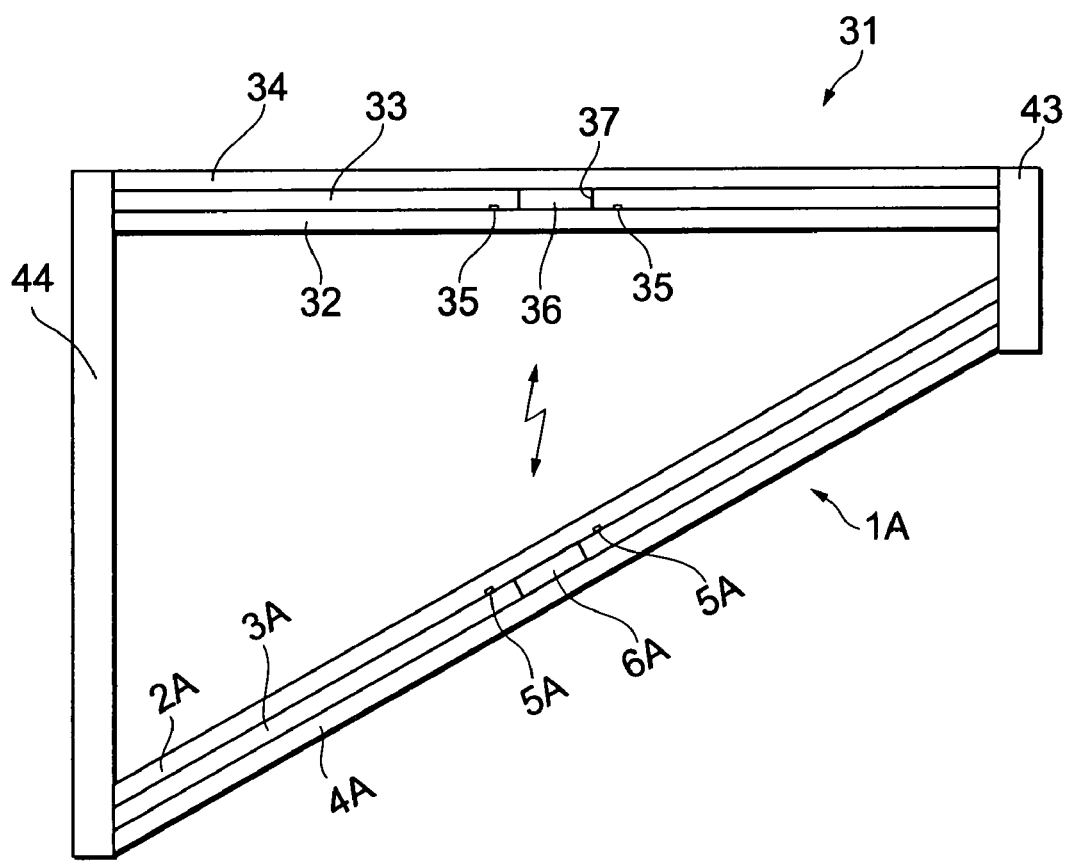

FIG. 5 illustrates a modified example of the antenna-containing substrate device, which corresponds to FIG. 4. In FIG. 5, the same parts as those shown in FIG. 4 are assigned the same reference numerals and hence, the description thereof is not repeated.

A first antenna-containing substrate 1A has a bottom substrate 4A, a center substrate 3A, and a top substrate 2A laminated thereon, similarly to the above-mentioned antenna-containing substrate 1. An IC chip 6A is fitted in a central portion of the center substrate 3A. An antenna 5A is wired so as to enclose the IC chip 6A.

A second antenna-containing substrate 31 is made horizontal, the first antenna-containing substrate 1A is made oblique from the horizontal second antenna-containing substrate 31, and both ends of the second antenna-containing substrate 31 and both ends of the first antenna-containing substrate 1A are respectively fixed to each other by fixing members 43 and 44 such that an antenna 35 in the second antenna-containing substrate 31 is at a position of the first antenna-containing substrate 1A when it is projected in the vertical direction. The positional relationship between the antenna 5A and the antenna 35 is thus defined, so that transmission efficiency is improved even if the first antenna-containing substrate 1A and the second antenna-containing substrate 31 are not parallel to each other (normals thereto are not parallel to each other).

Figure 6:
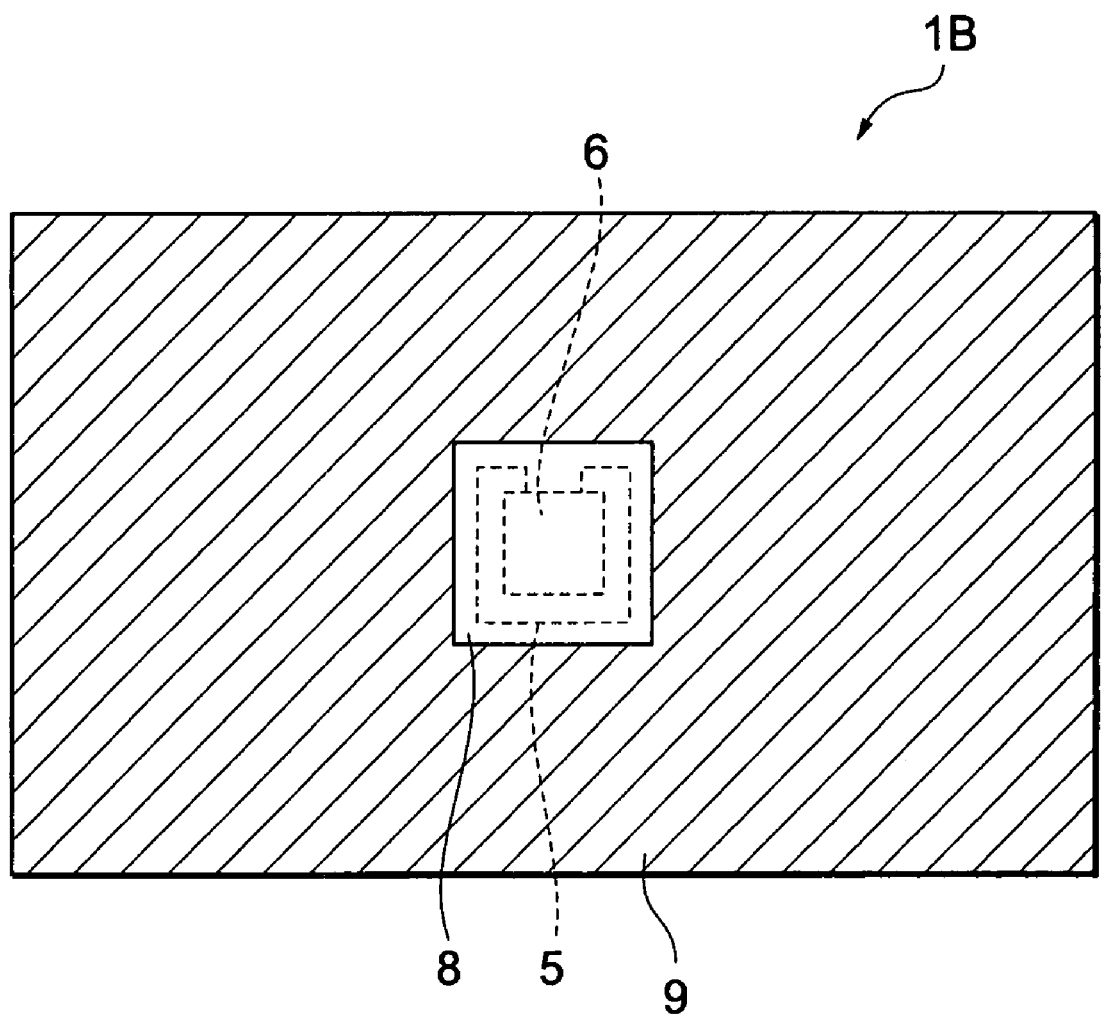
FIG. 6 is a plan view of an antenna-containing substrate.

FIG. 6 is a plan view of an antenna-containing substrate, showing another embodiment, which corresponds to FIG. 1A. In FIG. 6, the same parts as those shown in FIG. 1A are assigned the same reference numerals and hence, the description thereof is not repeated.

An antenna-containing substrate 1B according to the present embodiment also has a three-layer structure, similarly to the antenna-containing substrate 1 shown in FIGS. 1A and 1B. On an upper surface and a lower surface of the antenna-containing substrate 1B and an upper surface and a lower surface of a center substrate in the antenna-containing substrate 1B, no wiring pattern is provided in an area 8 around and inside an antenna 5. A wiring pattern is provided in an area 9 (indicated by hatching) excluding the area 8. Since no wiring pattern is provided in the area 8 around and inside the antenna 5 and no component is mounted thereon, the radio wave signal outputted from the antenna 5 can be prevented from being attenuated by a wiring pattern or a component to be mounted. Since the radio wave signal can be prevented from being attenuated, the outputted radio wave signal can be transmitted even if the level thereof is low, which allows power saving.

In the above-mentioned embodiment, on the upper surface or the like of the antenna-containing substrate 1B, no wiring pattern is provided (no component is mounted) in the area 8 in a portion corresponding to the periphery of the IC chip 6 and the antenna 5, and a wiring pattern is provided in the area 9 excluding the area 8. It goes without saying that not a mere wiring pattern is provided in the area 9 but a plane pattern connected to the ground or the power may be formed. The antenna-containing substrate 1B is produced such that a plane pattern is formed in the area 9 and no plane pattern is formed in the area 8. Since no plane pattern is formed in the area 8, the radio wave signal outputted from the antenna 5 can be prevented from being attenuated by a plane pattern, as described above.

Figure 7:
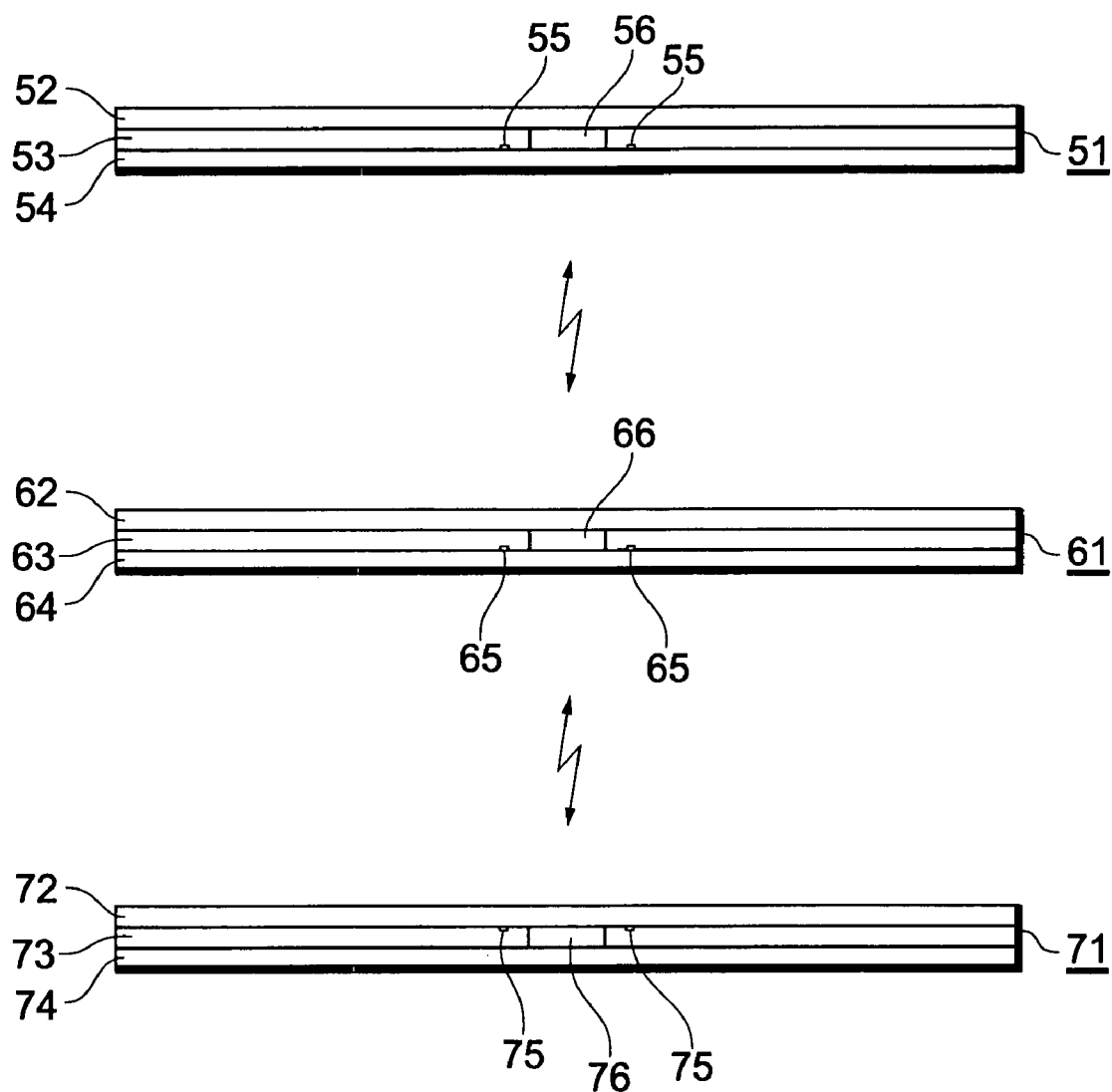
FIG. 7 is a cross-sectional view of an antenna-containing substrate device.
Figure 8:
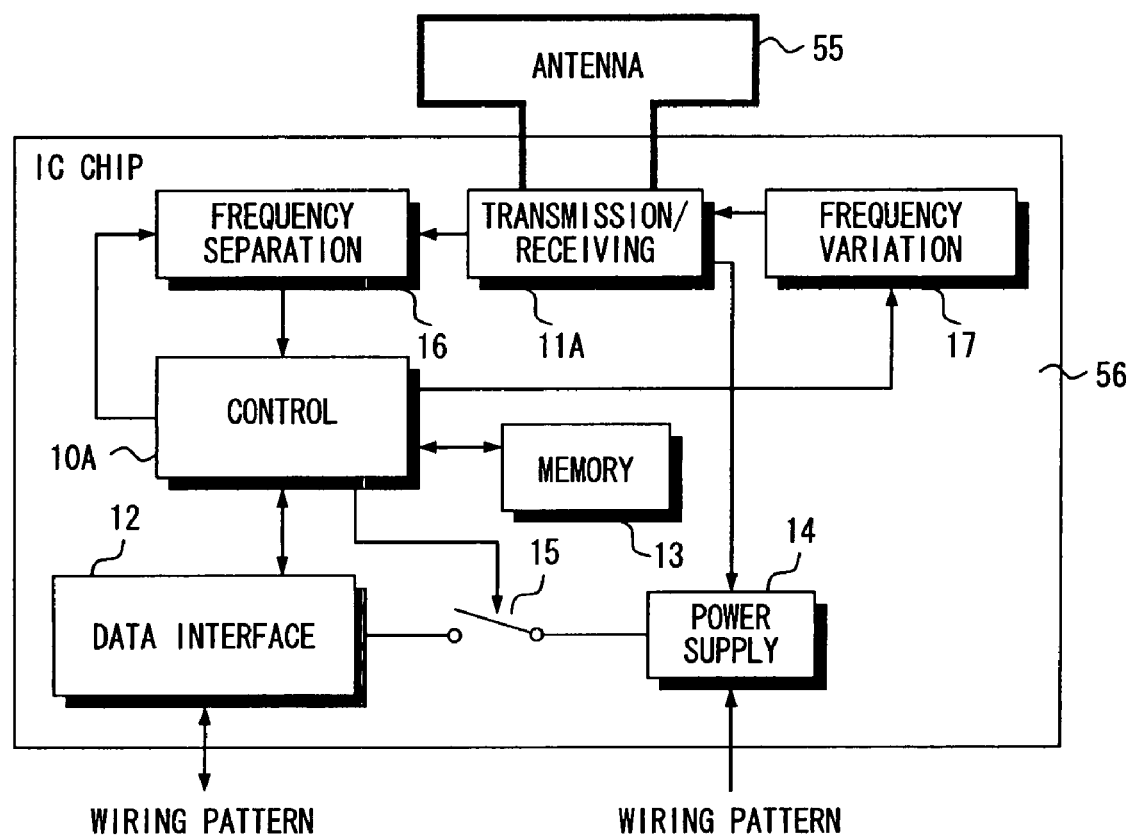
FIG. 8 is a block diagram showing the electrical configuration of an IC chip.
Figure 9:
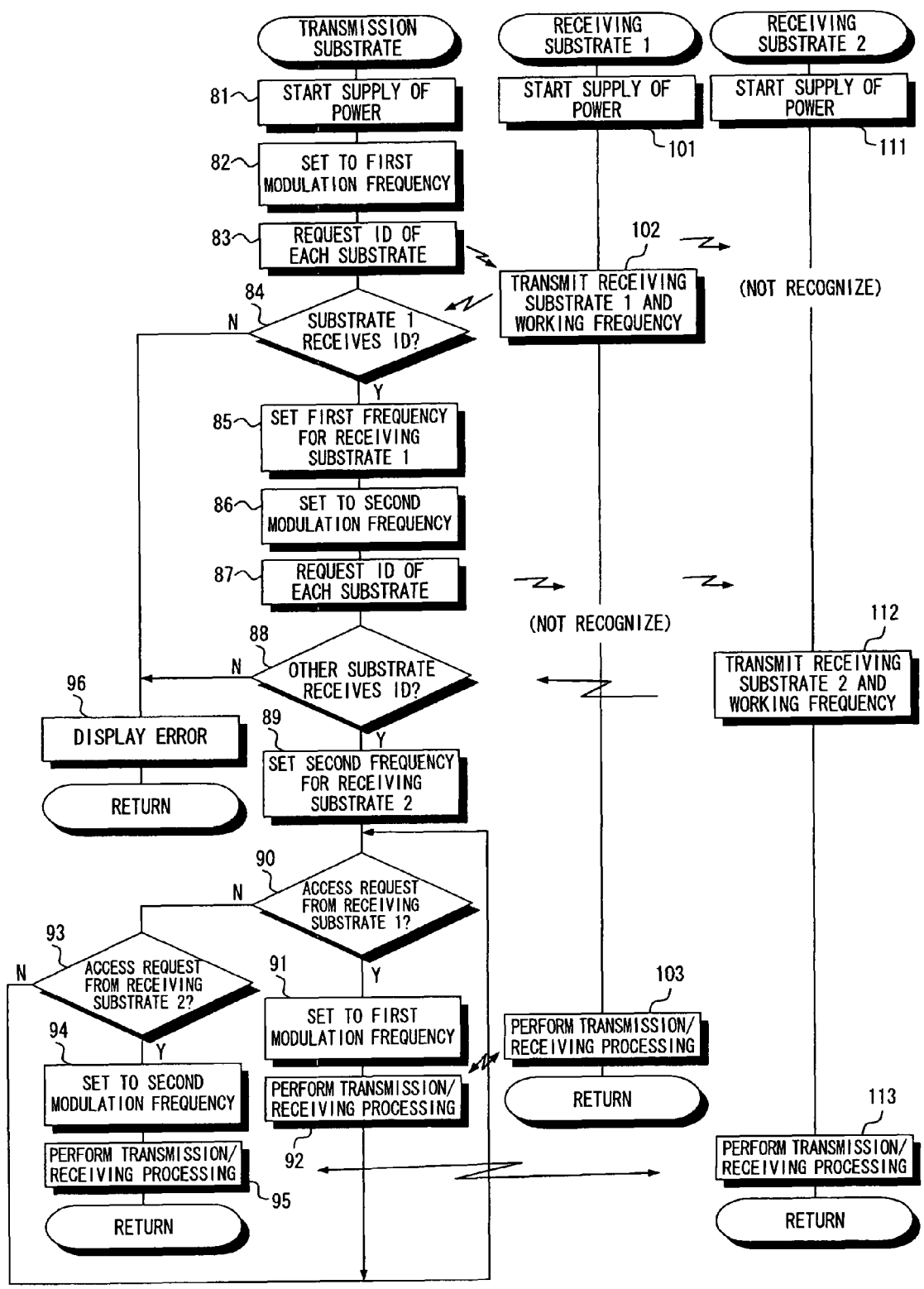
FIG. 9 is a flow chart showing the procedure for processing of an antenna-containing substrate device.

FIG. 7 to FIG. 9 illustrate another embodiment.

FIG. 7 is a cross-sectional view of an antenna-containing substrate device, which corresponds to FIG. 4, FIG. 5, etc.

The antenna-containing substrate device comprises a first antenna-containing substrate 51, a second antenna-containing substrate 61, and a third antenna-containing substrate 71.

In the antenna-containing substrates 51, 61, and 71, IC chips 56, 66, and 76 connected to and enclosed by antennas 55, 65, and 75 are respectively fitted in central portions of center substrates 53, 63, and 73. Further, substrates 52 and 54 are laminated above and below the center substrate 53 in the antenna-containing substrate 51, substrates 62 and 64 are laminated above and below the center substrate 63 in the antenna-containing substrate 61, and substrates 72 and 74 are laminated above and below the center substrate 73 in the antenna-containing substrate 71.

Data communication is established in the three antenna substrates 51, 61, and 71.

FIG. 8 is a block diagram showing the electrical configuration of the IC chip 56 in the first antenna-containing substrate 51. In FIG. 8, the same parts as those shown in FIG. 2 are assigned the same reference numerals and hence, the description thereof is not repeated.

The IC chip 56 includes a frequency separation circuit 16 and a frequency variation circuit 17 in addition to a control circuit 10A and a transmission/receiving circuit 11A connected to the antenna 55, as described above. The frequency variation circuit 17 controls the transmission/receiving circuit 11A so as to vary a modulation frequency used for modulating a signal in the transmission/receiving circuit 11A. Further, the frequency separation circuit 16 demodulates the signal received in the transmission/receiving circuit 11A and modulated therein. The frequency separation circuit 16 can separate and demodulate two types of modulation frequencies. The frequency separation circuit 16 may vary the modulation frequency under the control of the control circuit 10A.

The modulation frequency is varied depending on whether the first antenna-containing substrate 51 is used to communicate with the second antenna-containing substrate 61 or communicate with the third antenna-containing substrate 71, so that both communication between the first antenna-containing substrate 51 and the second antenna-containing substrate 61 and communication between the first antenna-containing substrate 51 and the third antenna-containing substrate 71 can be established without radio interference.

Although the IC chip 66 in the second antenna-containing substrate 61 and the IC chip 76 in the third antenna-containing substrate 71 also have the same configurations as the IC chip 56 in the first antenna-containing substrate 51, the IC chip 66 in the second antenna-containing substrate 61 and the IC chip 76 in the third antenna-containing substrate 71 do not necessarily require a circuit corresponding to the frequency variation circuit 17 when the first antenna-containing substrate 51 is taken as a transmission substrate, the second antenna-containing substrate 61 is taken as a first receiving substrate, and the third antenna-containing substrate 71 is taken as a second receiving substrate.

FIG. 9 is a flow chart showing the procedure for processing in the antenna-containing substrate device shown in FIG. 7.

One of the antenna-containing substrates 51, 61, and 71 is a transmission substrate, and the other two antenna-containing substrates are respectively a first receiving substrate and a second receiving substrate.

The supply of the power to all the IC chips in the transmission substrate and the first and second receiving substrates is started (steps 81, 101, and 111).

A frequency variation circuit included in the IC chip in the transmission substrate is set to a first modulation frequency (step 82). It is assumed that a signal modulated using the first modulation frequency can be demodulated in the first receiving substrate and cannot be demodulated in the second receiving substrate. Further, it is assumed that a signal modulated using a second modulation frequency, described later, cannot be demodulated in the first receiving substrate and can be demodulated in the second receiving substrate.

An ID is requested of the first receiving substrate and the second receiving substrate from the transmission substrate using the signal modulated using the first modulation frequency (step 83).

When an ID request signal from the transmission substrate is received in the first receiving substrate, it is detected that the ID request signal is a request for an ID by being demodulated. An ID indicating that the antenna-containing substrate is the first receiving substrate and a signal representing a working frequency are transmitted to the transmission substrate (step 102). Even if the ID request signal from the transmission substrate is received in the second receiving substrate, the ID request signal cannot be demodulated by the second receiving substrate, so that the contents thereof are not recognized.

When the ID indicating that the antenna-containing substrate is the first receiving substrate and the signal representing the working frequency are received in the transmission substrate (YES in step 84), the first modulation frequency is set to a modulation frequency for the first receiving substrate (step 85).

Then, the frequency variation circuit included in the IC chip in the transmission substrate is set to a second modulation frequency (step 86). The ID request signal is modulated using the set second modulation frequency, and is transmitted to the first receiving substrate and the second receiving substrate (step 87). The signal modulated using the second modulation frequency is not recognized in the first receiving substrate but is recognized in the second receiving substrate. An ID indicating that the antenna-containing substrate is the second receiving substrate and the signal representing the working frequency are transmitted to the transmission substrate from the second receiving substrate (step 112).

When the ID and the signal representing the working frequency that have been transmitted from the second receiving substrate are received in the transmission substrate (YES in step 88), the second modulation frequency is set to a modulation frequency for the second receiving substrate (step 89).

When an access request from the first receiving substrate is received in the transmission substrate using the signal modulated using the first modulation frequency (YES in step 90), the frequency variation circuit in the transmission substrate is set to the first modulation frequency (step 91). Transmission/receiving processing is performed between the transmission substrate and the first receiving substrate using the signal modulated using the first modulation frequency (steps 92 and 103).

When an access request from the second receiving substrate is received in the transmission substrate using the signal modulated using the second modulation frequency (YES in step 93), the frequency variation circuit in the transmission substrate is set to the second modulation frequency (step 94). Transmission/receiving processing is performed between the transmission substrate and the second receiving substrate using the signal modulated using the second modulation frequency (steps 95 and 113).

A signal can be transmitted and received between the transmission substrate and the first or second receiving substrate without radio interference.

Figure 10A:
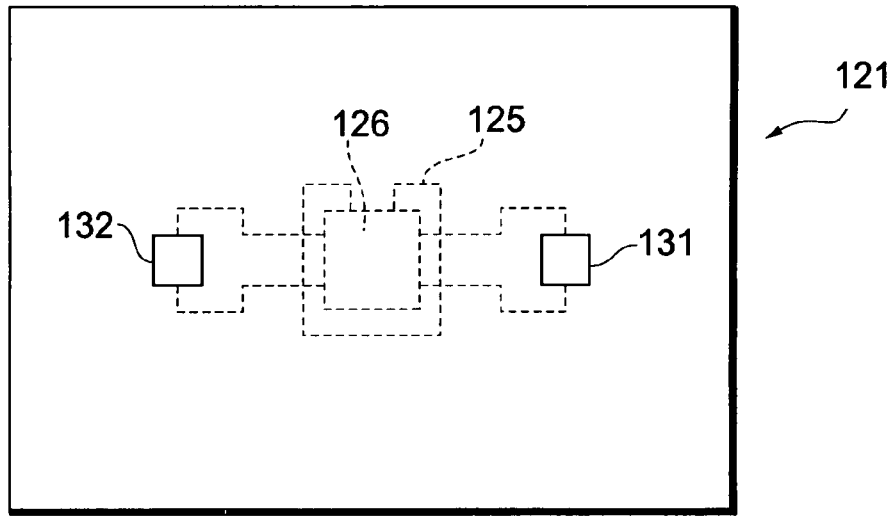
FIG. 10A is a plan view of an antenna-containing substrate.
Figure 10B:
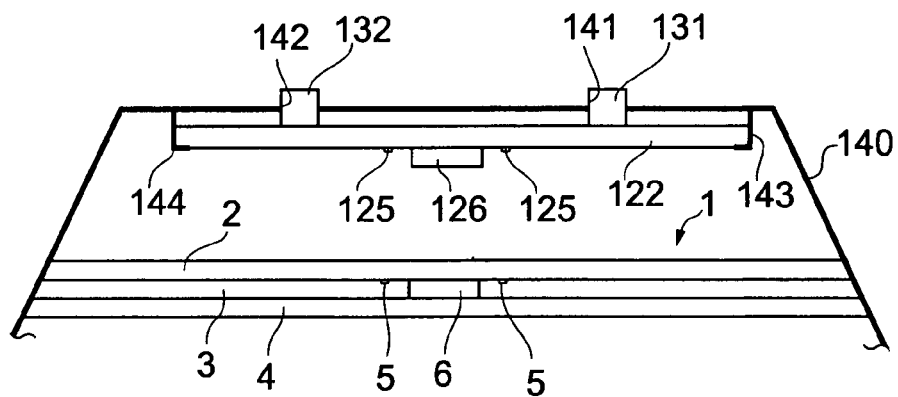
FIG. 10B is a cross-sectional view of an electronic device including the antenna-containing substrate.

FIG. 10A and FIG. 10B illustrate another embodiment. FIG. 10A is a plan view of an antenna-containing substrate mounted on an electronic device, and FIG. 10B is a cross-sectional view of the electronic device, showing how the antenna-containing substrate shown in FIG. 10A is mounted on the electronic device. In FIGS. 10A and 10B, the same parts as those shown in FIGS. 1A and 1B are assigned the same reference numerals and hence, the description thereof is not repeated.

Referring to FIG. 10A, a switch substrate 121 includes a substrate 122, and an IC chip 126 is mounted on a central portion on a lower surface of the substrate 122. An antenna 125 wired so as to enclose the IC chip 126 is connected to the IC chip 126.

Switch circuits 131 and 132 are mounted with a portion on which the IC chip 126 is mounted sandwiched therebetween on an upper surface of the switch substrate 121. The switch circuits 131 and 132 are connected to the IC chip 126 by a wiring pattern.

Referring to FIG. 10B, a case 140 of the electronic device is provided with openings 141 and 142 at positions corresponding to the switch circuits 131 and 132 provided in the switch substrate 121. Supporting members 143 and 144 are respectively formed at positions corresponding to the length of the switch substrate 121 inside the case 140 of the electronic device. The switch substrate 121 is fixed to the inside of the electronic device by the supporting members 143 and 144. Consequently, the switch circuits 131 and 132 provided in the switch substrate 121 are exposed from the openings 141 and 142 provided in the case 140 of the electronic device, and are thus made operable from the outside of the case 140.

An antenna-containing substrate 1, described above, is fixed in the case 140 of the electronic device a predetermined distance apart from the switch substrate 121.

A signal can be transmitted and received between the switch substrate 121 and the antenna-containing substrate 1, so that signals respectively representing the operations of the switch circuits 131 and 132 provided in the switch substrate 121 are transmitted to the antenna-containing substrate 1 from the switch substrate 121. Even if the switch substrate 121 and the antenna-containing substrate 1 are not electrically connected to each other, respective operating state in the switch circuits 131 and 132 can be detected in the antenna-containing substrate 1.

Figure 11:
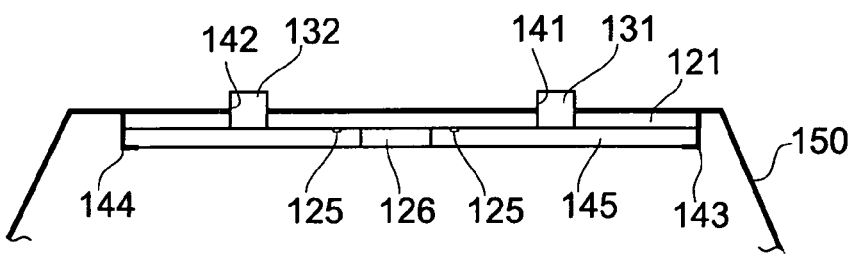
FIG. 11 to FIG. 13 are cross-sectional views of an electronic device including an antenna-containing substrate.

FIG. 11 illustrates a modified example, which corresponds to FIG. 10B.

In the modified example, a lower surface of a substrate 121 is protected by resin 145.

Figure 12:
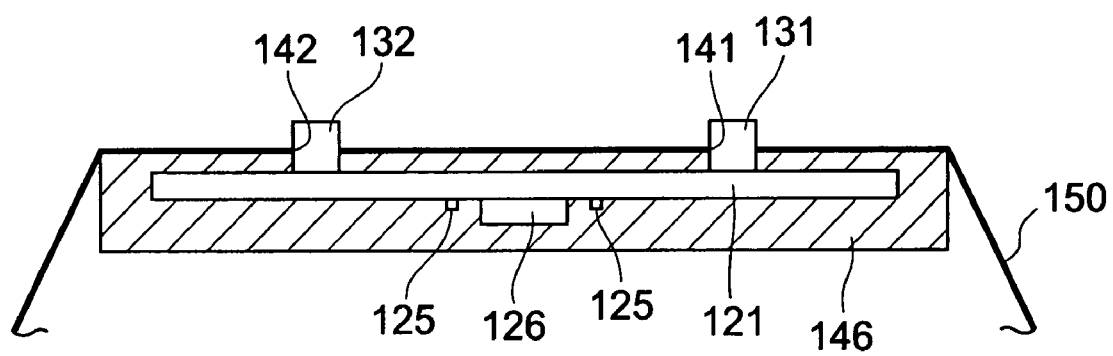

FIG. 12 illustrates another modified example, which also corresponds to FIG. 10B.

In the modified example, resin 146 is formed between an upper surface of a switch substrate 121 and a case 151, on a side surface of the switch substrate 121, and on a lower surface of the switch substrate 121. The switch substrate 121 is attached to an inner surface of the case 151 with the whole switch substrate 121 covered with the resin 146. Thus, the whole switch substrate 121 is protected by the resin 146.

Figure 13:
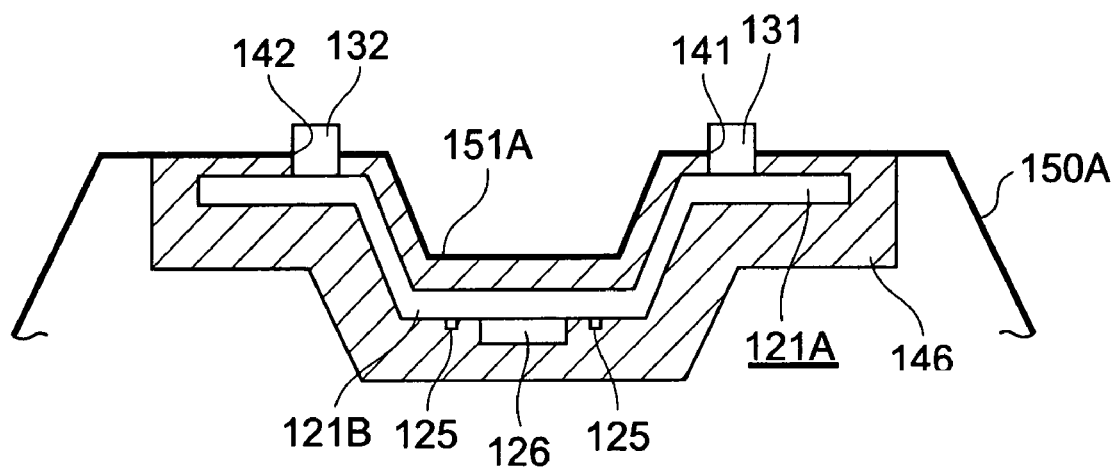

FIG. 13 illustrates still another modified example, which also corresponds to FIG. 10B.

A recess (a curved portion) 151 is formed in a case 150A. A switch substrate 121A is a flexible substrate, and can be relatively freely folded. Thus, the switch substrate 121A is also curved so as to be matched with the recess 151 in the case 150A (a curved portion 121B). Further, the switch substrate 121A is covered with resin 146, similarly to the switch substrate 121 shown in FIG. 12. It goes without saying that the switch substrate 121A need not be covered with the resin 146. Since the switch substrate 121A is a flexible substrate, it can be matched with the shape of the case 150A. Further, the distance between the switch substrate 121A and the antenna-containing substrate 1 can be reduced, so that efficient communication can be established between the antenna-containing substrate 1 and the switch substrate 121A.

Figure 14:
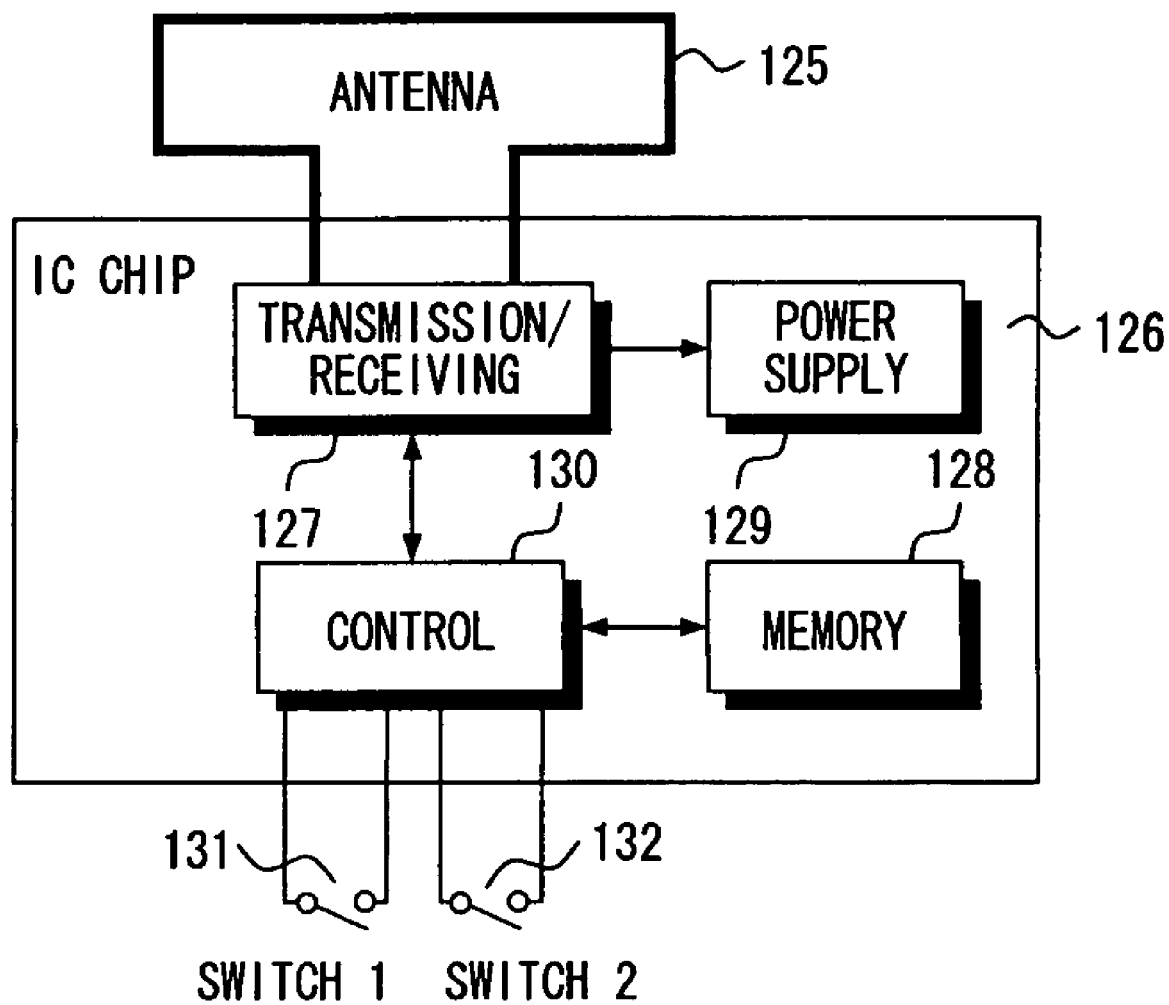
FIG. 14 is a block diagram showing the electrical configuration of an IC chip.

FIG. 14 is a block diagram showing the electrical configuration of the above-mentioned IC chip 126.

The IC chip 126 includes a control circuit 130 for controlling the overall operation.

A transmission/receiving circuit 127 is connected to an antenna 125. A power supply circuit 129 is connected to the transmission/receiving circuit 127, so that the power is generated by the power supply circuit 129 using a received radio wave signal. Further, a memory 128 and switches 131 and 132 are connected to the control circuit 130. The operation of the switches 131 and 132 is detected by the control circuit 130. The detected results will be transmitted to an antenna-containing substrate 1, described above, by the antenna 125.

Figure 15A:
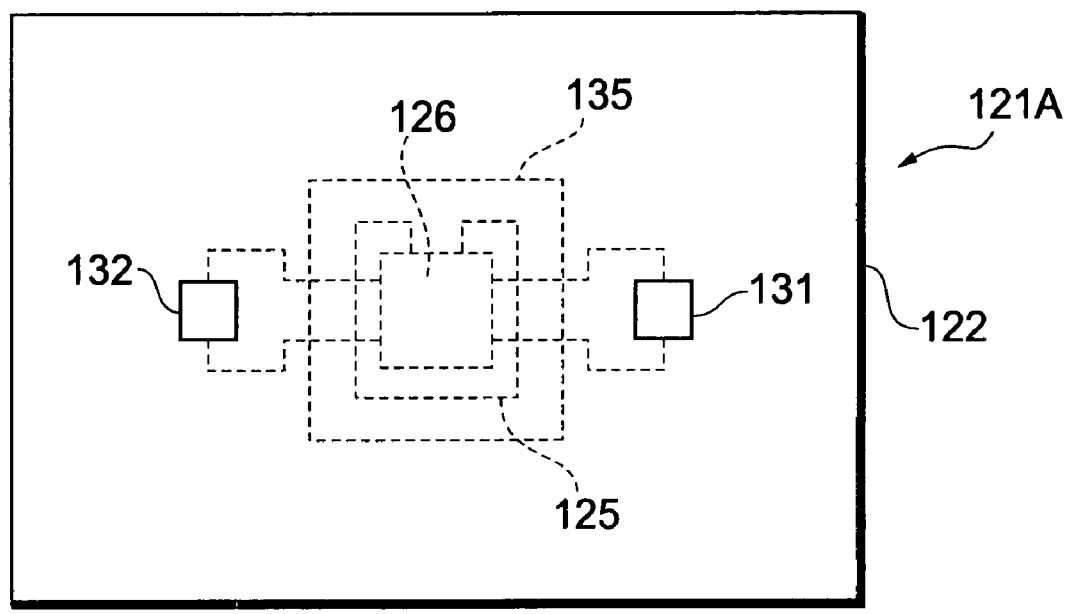
FIG. 15A is a plan view of an antenna-containing substrate.
Figure 15B:
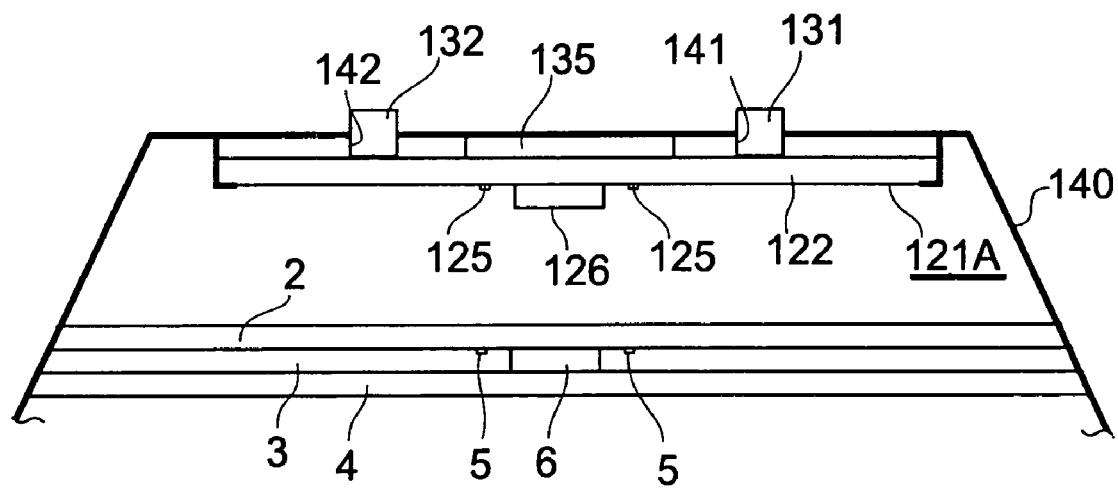
FIG. 15B is a cross-sectional view of an electronic device including the antenna-containing substrate.

FIG. 15A and FIG. 15B illustrate a modified example. FIG. 15A is a plan view of a switch substrate, which corresponds to FIG. 10A, and FIG. 15B is a cross-sectional view of an electronic device, which corresponds to FIG. 10B. In FIGS. 15A and 15B, the same parts as those shown in FIGS. 10A and 10B are assigned the same reference numerals and hence, the description thereof is not repeated.

In the modified example, on an upper surface of a substrate 122 constituting a switch substrate 121A, there is provided a shield (will be composed of a magnetic material such as iron) 135 for electromagnetically shielding a portion corresponding to the periphery of an IC chip 126 and an antenna 125. The shield 135 is provided between a case 140 and the substrate 122, so that a radio wave signal transmitted from the antenna 125 in the switch substrate 121A can be prevented from affecting a device in the vicinity of electronic equipment.

Figure 16:
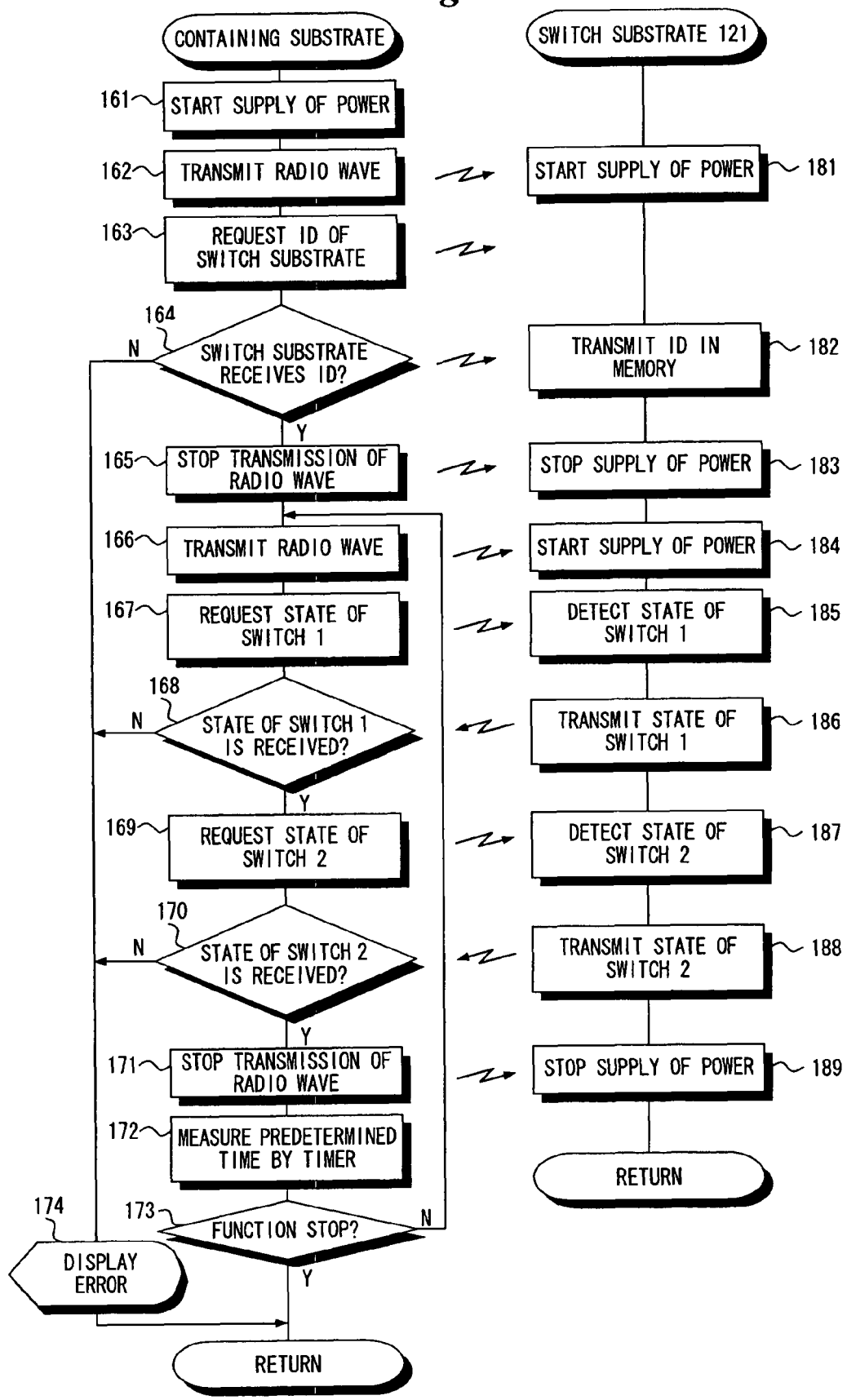
FIG. 16 is a flow chart showing the procedure for communication processing between an antenna-containing substrate and a switch substrate.

FIG. 16 is a flow chart showing the procedure for transmission/receiving processing between a switch substrate and an antenna-containing substrate.

The power is supplied to the antenna-containing substrate 1 (step 161), and a radio wave signal is transmitted from the antenna 5 in the antenna-containing substrate 1 (step 162).

When the radio wave signal is received by the antenna 125 in the switch substrate 121, the power is generated, so that the supply of the power is started (step 181).

An ID request signal is transmitted to the switch substrate 121 from the antenna-containing substrate 1 (step 163). When the ID request signal is received in the switch substrate 121, a signal representing an ID stored in the switch substrate 121 is transmitted to the antenna-containing substrate 1 from the switch substrate 121 (step 182).

Unless the signal representing the ID of the switch substrate is received in the antenna-containing substrate 1 (NO in step 164), an error is displayed on the electronic device (step 174). When the signal representing the ID of the switch substrate 121 is received in the antenna-containing substrate 1 (YES in step 164), the transmission of the radio wave signal to the switch substrate 121 is stopped (step 165). Consequently, the supply of the power to the switch substrate 121 is stopped (step 183).

When the radio wave signal is transmitted to the switch substrate 121 from the antenna-containing substrate 1 again (step 166), the supply of the power to the switch substrate 121 is started (step 184).

A signal for requesting an operating state in the first switch 131 is transmitted to the switch substrate 121 from the antenna-containing substrate 1 (step 167). The operating state in the first switch 131 is detected in the switch substrate 121 in response to the request signal (step 185), and a signal representing the detected operating state is transmitted to the antenna-containing substrate 1 (step 186).

Unless the signal representing the operating state in the first switch 131 in the switch substrate 121 is received in the antenna-containing substrate 1 (NO in step 168), an error occurs (step 174). When the signal representing the operating state in the first switch 131 is received (YES in step 168), a signal for requesting an operating state in the second switch 132 is then transmitted. The operating state in the second switch 132 is detected in the switch substrate 121 in response to the request signal (step 187), and a signal representing the detected operating state is transmitted to the antenna-containing substrate 1 (step 188).

Unless the signal representing the operating state in the second switch 132 in the switch substrate 121 is received in the antenna-containing substrate 1 (No in step 170), an error occurs (step 174). When the signal representing the operating state in the second switch 132 is received (YES in step 170), the transmission of the radio wave signal is stopped (step 171). The supply of the power to the switch substrate 121 is stopped (step 189).

In the antenna-containing substrate 1, a timer measures a predetermined time period (step 172). If no function stop command is given (NO in step 173), processing in the step 166 and the subsequent steps is repeated again. When a function stop command is given (YES in step 173), the processing is terminated.

Figure 17:
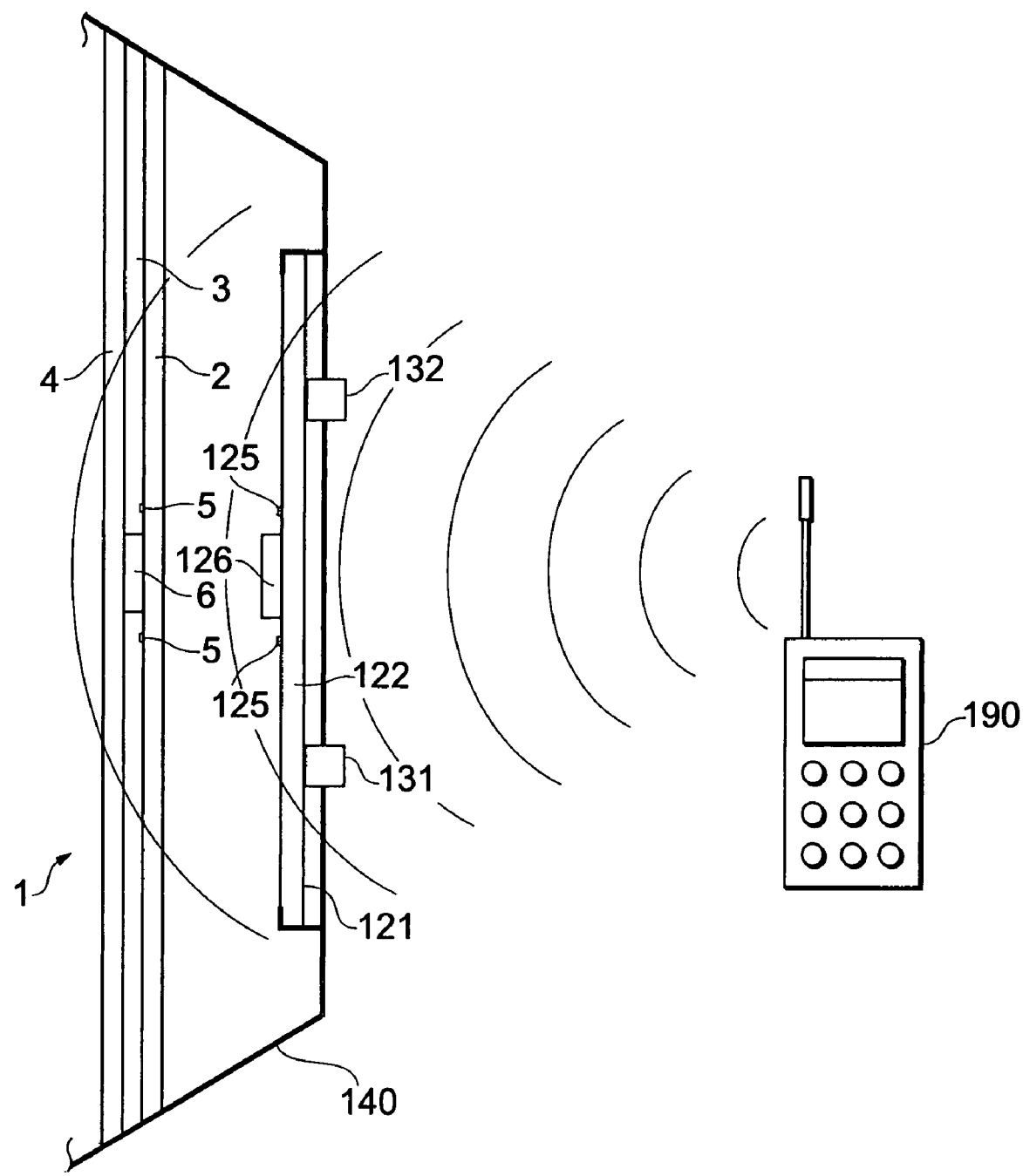
FIG. 17 illustrates a controller and an electronic device.

FIG. 17 illustrates an electronic device and a controller, showing another embodiment. In FIG. 17, the same parts as those shown in FIGS. 10A and 10B are assigned the same reference numerals and hence, the description thereof is not repeated.

The electronic device has a switch substrate 121 and an antenna-containing substrate 1 contained in its case 140, as described above. There is a controller 190 outside the electronic device. The controller 190 controls the switch substrate 121 and the antenna-containing substrate 1.

An antenna, an IC chip, and so on may be mounted not on a substrate but inside the case 140 of the electronic device.

Figure 18:
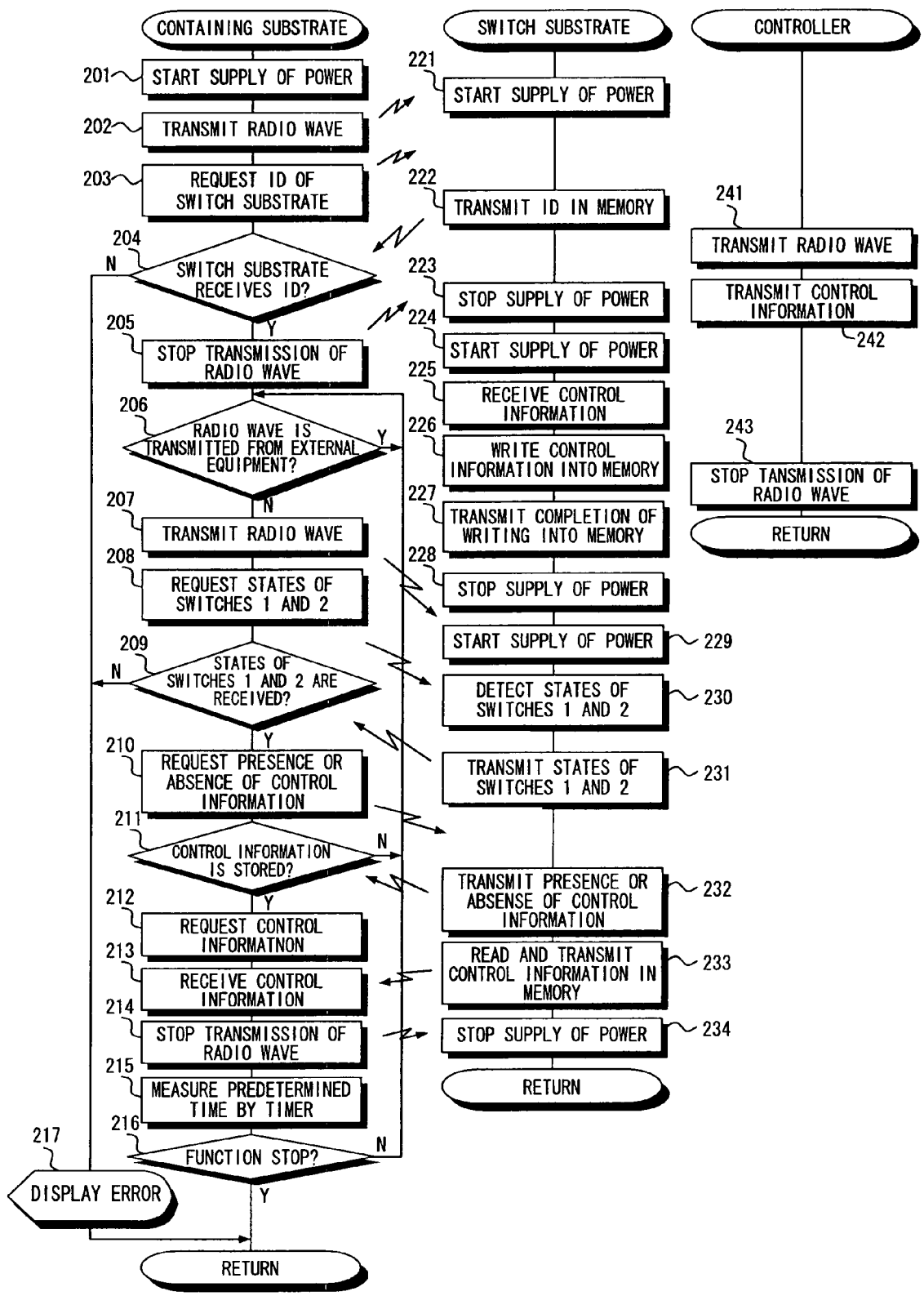
FIG. 18 is a flow chart showing the procedure for communication processing between a controller and an antenna-containing substrate and a switch substrate that are included in an electronic device.

FIG. 18 is a flow chart showing the procedure for processing of the antenna-containing substrate 1 and the switch substrate 121 inside the electronic device and the controller 190.

In processing, described below, the antenna-containing substrate 1 communicates with both the switch substrate 121 and the controller 190. The switch substrate 121 transmits a radio wave signal from the antenna-containing substrate 1 in response to the transmission of a radio wave signal. Consequently, the radio wave signal received in the antenna-containing substrate 1 is processed as not one from the switch substrate 121 but one from the controller 190 irrespective of the transmission of the radio wave signal from the antenna-containing substrate 1.

The supply of the power to the antenna-containing substrate 1 is started (step 201), and the radio wave signal is transmitted to the switch substrate 121 from the antenna-containing substrate 1 (step 202). When the radio wave signal is received in the switch substrate 121, the power is generated from the received radio wave signal, and is supplied to the switch substrate 121 (step 221).

A radio wave signal for requesting an ID is transmitted to the switch substrate 121 from the antenna-containing substrate 1 (step 203). An ID stored in a memory in the switch substrate 121 is read in response to the radio wave signal transmitted from the antenna-containing substrate 1, and a radio wave signal representing the ID is transmitted to the antenna-containing substrate 1 from the switch substrate 121 (step 222).

Unless the antenna-containing substrate 1 receives the radio wave signal representing the ID within a predetermined time period (No in step 204), an error is displayed (step 217).

When the antenna-containing substrate 1 receives the radio wave signal representing the ID within a predetermined time period (YES in step 204), the transmission of the radio wave signal from the antenna-containing substrate 1 is stopped (step 205). Consequently, the supply of the power to the switch substrate 121 is stopped (step 223).

When the radio wave signal is transmitted from the controller 190 (step 241), the radio wave signal is received in the antenna-containing substrate 1. While the radio wave signal from the controller 190 is received (YES in step 206), the radio wave signal is not transmitted from the antenna-containing substrate 1. The radio wave signal transmitted from the controller 190 is also received in the switch substrate 121. The power is generated from the received radio wave signal, so that the supply of the power is started (step 224).

A radio wave signal representing control information is transmitted to the switch substrate 121 from the controller 190 (step 242), and is received in the switch substrate 121 (step 225). The control information represented by the received radio wave signal is written into the memory in the switch substrate 121 (step 226). Consequently, a radio wave signal representing the completion of the writing into the memory is transmitted to the controller 190 from the switch substrate 121 (step 227). When the radio wave signal representing the completion of the writing into the memory is received in the controller 190, the transmission of the radio wave signal from the controller 190 is stopped (step 243). Consequently, the supply of the power to the switch substrate 121 is stopped (step 228).

When the stop of the transmission of the radio wave signal from the controller 190 is detected in the antenna-containing substrate 1 (NO in step 206), a radio wave signal is transmitted to the switch substrate 121 from the antenna-containing substrate 1 (step 207). When the radio wave signal is received in the switch substrate 121, the supply of the power to the switch substrate 121 is started (step 229).

A radio wave signal representing a request to transmit respective switch operating states in a first switch 131 and a second switch 132 is transmitted to the switch substrate 121 from the antenna-containing substrate 1 (step 208). When the radio wave signal is received in the switch substrate 121, the operating states in the first switch 131 and the second switch 132 are detected (step 230), and a radio wave signal representing the operating states is transmitted to the antenna-containing substrate 1 (step 231).

Unless the radio wave signal representing the switch operating states is received within a predetermined time period elapsed since the request to transit the switch operating states was issued (NO in step 209), an error occurs (step 217).

When the radio wave signal representing the switch operating states is received within a predetermined time period elapsed since the request to transmit the switch operating states was issued (YES in step 209), a radio wave signal for requesting the presence or absence of the control information from the controller 190 is transmitted to the switch substrate 121 from the antenna-containing substrate 1 (step 210). When the radio wave signal is received in the switch substrate 121, it is confirmed whether or not the control information is stored in the memory in the switch substrate 121. A radio wave signal indicating whether or not the control information is stored is transmitted to the antenna-containing substrate 1 from the switch substrate 121 (step 232).

When the control information from the controller 190 is stored in the switch substrate 121 (YES in step 211), a radio wave signal for requesting the control information is transmitted to the switch substrate 121 from the antenna-containing substrate 1 (step 212). The radio wave signal is received in the switch substrate 121, so that the control information stored in the switch substrate 121 is read and is transmitted as a radio wave signal to the antenna-containing substrate 1 (step 233).

When the radio wave signal transmitted from the switch substrate 121 is received in the antenna-containing substrate 1, the transmission of the radio wave signal for generating the power that has been transmitted to the switch substrate 121 is stopped (step 214). Consequently, the supply of the power to the switch substrate 121 is stopped (step 234).

A predetermined time period has elapsed since the transmission of the radio wave signal from the antenna-containing substrate 1 was stopped (step 215). Unless a function stop command is given to the antenna-containing substrate 1 (NO in step 216), the processing in the step 206 and the subsequent steps is repeated.

Figure 19:
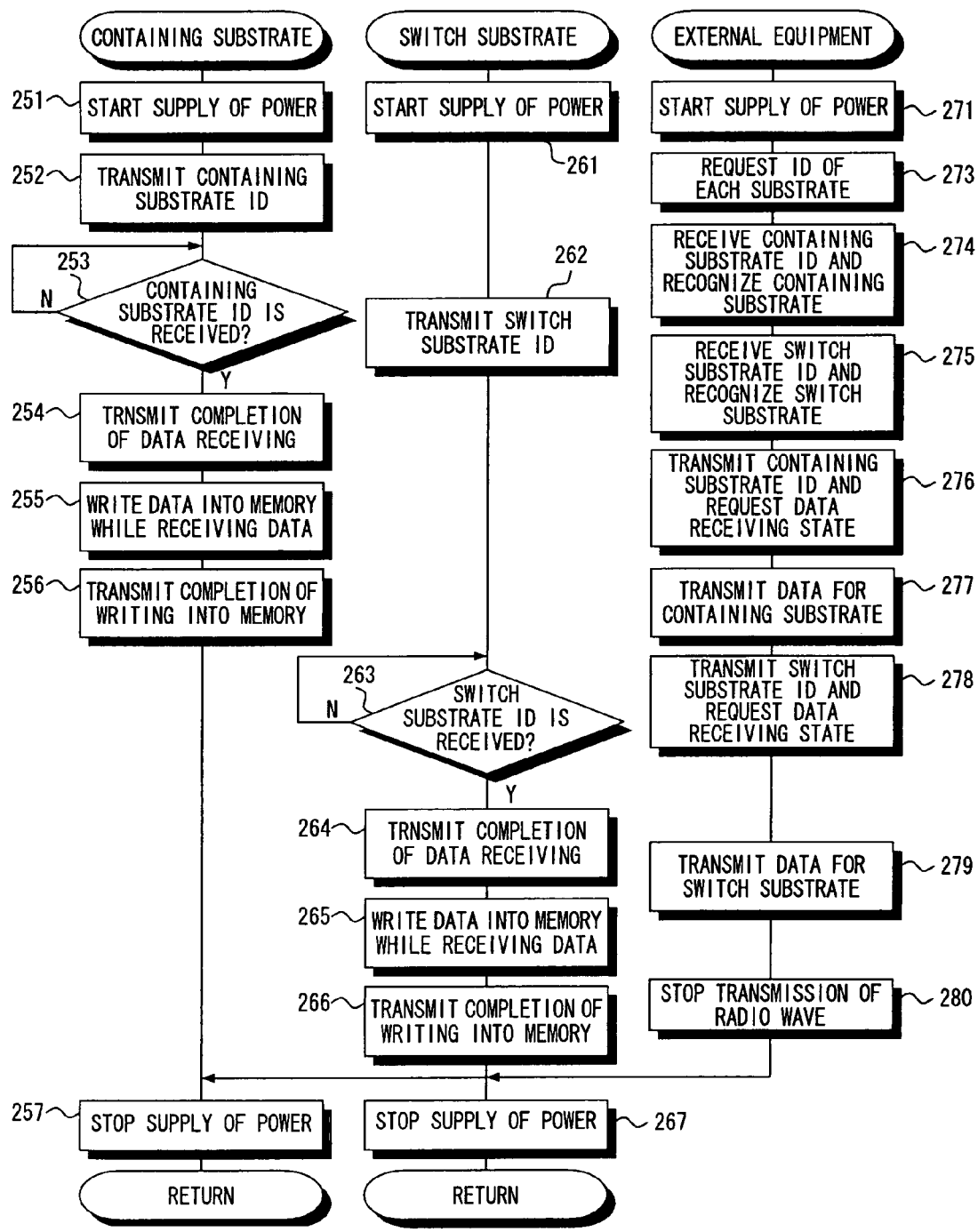
FIG. 19 is a flow chart showing the procedure for communication processing between an external device and an antenna-containing substrate and a switch substrate that are included in an electronic device.

FIG. 19 is a flow chart showing the procedure for transmission processing performed among an antenna-containing substrate, a switch substrate, and external equipment, showing still another embodiment. The antenna-containing substrate and the switch substrate are stored in an electronic device different from the external equipment.

This processing is for transmitting data such as a firmware to the antenna-containing substrate and the switch substrate from the external equipment and storing the transmitted data.

A radio wave signal is transmitted from the external equipment (step 271), and the supply of the power to both the antenna-containing substrate and the switch substrate is started (steps 251 and 261). Thereafter, a radio wave signal for requesting an ID is transmitted to the antenna-containing substrate and the switch substrate from the external equipment (step 273).

A radio wave signal representing an ID of the antenna-containing substrate is transmitted from the antenna-containing substrate (step 252), and is received in the external equipment. Consequently, the antenna-containing substrate is recognized in the external equipment (step 274). Similarly, a radio wave signal representing an ID of the switch substrate is transmitted from the switch substrate (step 262), and is received in the external equipment, so that the switch substrate is recognized in the external equipment (step 275).

The ID of the antenna-containing substrate and a radio wave signal representing a request of a data receiving state are transmitted to the antenna-containing substrate from the external equipment (step 276).

When the radio wave signal transmitted from the external equipment is received in the antenna-containing substrate (YES in step 253), the antenna containing substrate transmits, if data receiving is completed, a radio wave signal representing the completion of the data receiving (step 254).

When the radio wave signal transmitted from the antenna-containing substrate is received in the external equipment, data for the antenna-containing substrate is transmitted to the antenna-containing substrate from the external equipment (step 277). The data for the antenna-containing substrate, which has been transmitted from the external equipment, is written into a memory in the antenna-containing substrate while being received in the antenna-containing substrate (step 255). When the writing into the memory is terminated, a radio wave signal indicating that the writing is completed is transmitted to the external equipment from the antenna-containing substrate (step 256).

The ID of the switch substrate and a radio wave signal representing a request of a data receiving state are transmitted to the switch substrate from the external equipment (step 278), as in the case of the antenna-containing substrate.

When the radio wave signal transmitted from the external equipment is received in the switch substrate (YES in step 263), the switch substrate transmits, if data receiving is completed, a radio wave signal representing the completion of the data receiving (step 264).

When the radio wave signal transmitted from the switch substrate is received in the external equipment, data for the switch substrate is transmitted to the switch substrate from the external equipment (step 279). The data for the switch substrate, which has been transmitted from the external equipment, is written into a memory in the switch substrate while being received in the switch substrate (step 265). When the writing into the memory is terminated, a radio wave signal indicating that the writing is completed is transmitted to the external equipment from the switch substrate (step 266).

The transmission of the radio wave signal from the external equipment is stopped, so that the supply of the power to the antenna-containing substrate and the switch substrate is stopped (steps 257 and 267).

The power can be supplied to the antenna-containing substrate and the switch substrate irrespective of the state of the power to the electronic device including the antenna-containing substrate and the switch substrate, and data can be stored therein. In a case where the data is stored in the antenna-containing substrate or the switch substrate when the power to the electronic device is off, the data stored in the memories in the antenna-containing substrate and the switch substrate are read out when the power to the electronic device is turned on, and are stored in a main memory in the electronic device.

Figure 20:
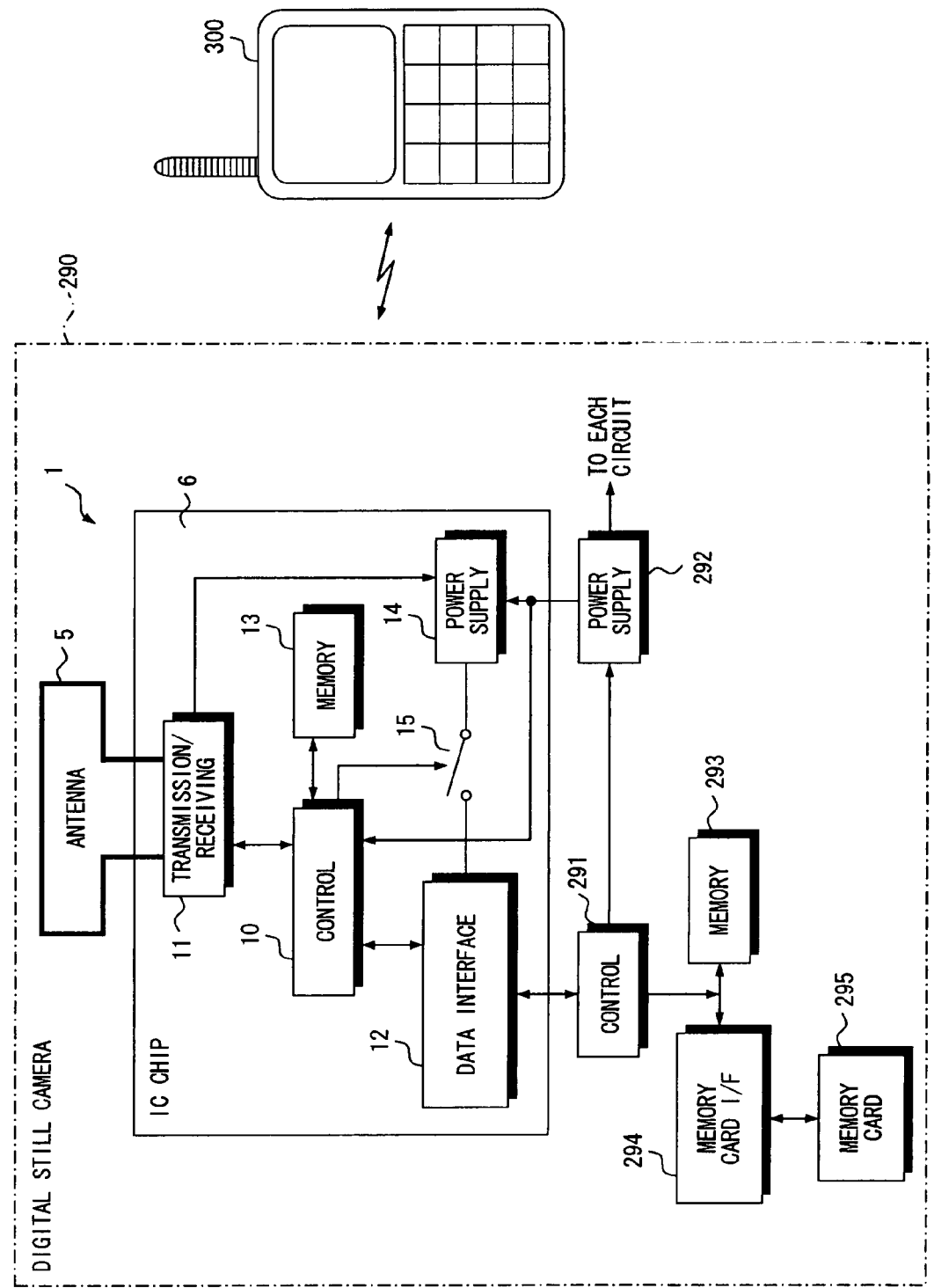
FIG. 20 is a block diagram showing a part of the electrical configuration of a digital still camera.
Figure 21:
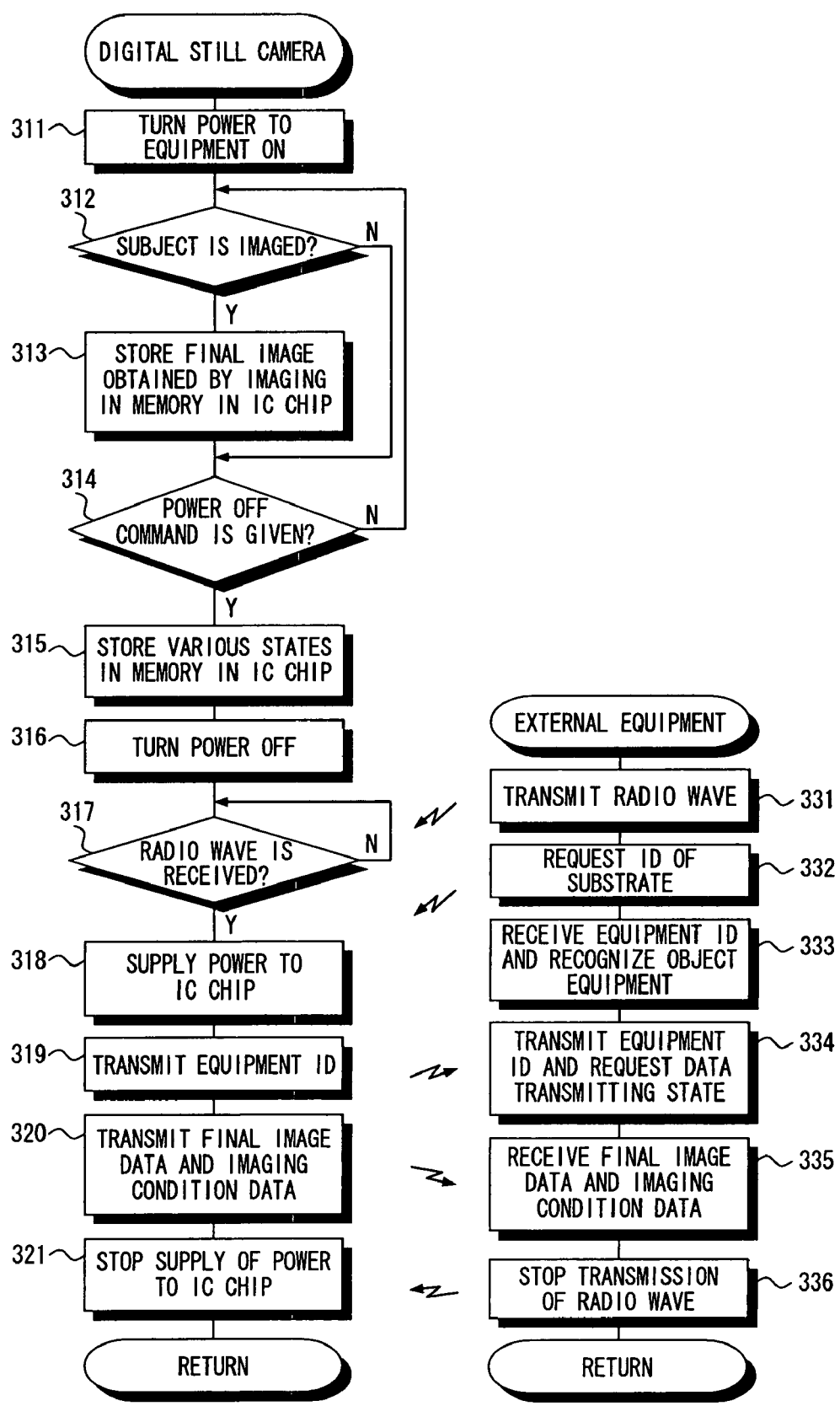
FIG. 21 is a flow chart showing the procedure for communication processing between a digital still camera and an external device.

FIG. 20 and FIG. 21 illustrate a further embodiment.

FIG. 20 is a block diagram showing the electrical configuration of a digital still camera. In FIG. 20, the same parts as those shown in FIG. 2 are assigned the same reference numerals and hence, the description thereof is not repeated.

A digital still camera 290 can communicate with an external device 300.

The overall operation of the digital still camera 290 is controlled by a control circuit 291.

A memory 293 storing an operation program and other data is connected to the control circuit 291.

The digital still camera 290 includes a power supply 292. The power supply 292 supplies the power to each of circuits constituting the digital still camera 290. Further, the digital still camera 290 includes an imaging device (not shown) that images a subject and outputs image data representing a subject image. The image data obtained by the imaging device is applied to a memory card 295 through a memory card interface 294, and is recorded thereon.

The digital still camera 290 includes an antenna-containing substrate 1, described above.

A data interface 12 contained in an IC chip 6 in the antenna-containing substrate 1 is connected to the control circuit 291, and a power supply circuit 14 and a control circuit 10 that are contained in the IC chip 6 are connected to the power supply 292.

FIG. 21 is a flow chart showing the procedure for processing of the digital still camera 290 and the external device 300.

This processing is for storing image data representing an image obtained by final imaging and data representing conditions of the imaging in the memory 13 within the IC chip 6 when the power to the digital still camera 290 is turned off, and transmitting the image data and the imaging condition data to the external device 300 without turning the digital still camera 290 on in response to a request from the external device 300.

First, the power to the digital still camera 290 is turned on (step 311). When the subject is imaged (YES in step 312), image data representing the final image obtained by the imaging is stored in the memory 13 within the IC chip 6 (step 313). It goes without saying that the image data representing the image obtained by the imaging is also recorded on the memory card 295. Unless a command to turn the power to the digital still camera 290 off is given (NO in step 314), the processing in the steps 312 and 313 is repeated.

When the command to turn the power to the digital still camera 290 off is given (YES in step 314), data representing imaging conditions such as a shutter speed and an f-stop value are also stored in the memory 13 within the IC chip 6 (step 315). Thereafter, the power to the digital still camera 290 is turned off (step 316).

When a radio wave signal is transmitted from the external device 300 (step 331), and is received in the antenna 5 in the antenna-containing substrate 1 contained in the digital still camera 290 (YES in step 317), the power is generated from the radio wave signal by the power supply circuit 14 within the IC chip 6, and is supplied to the IC chip 6 (step 318).

An ID is requested of the antenna-containing substrate 1 within the digital still camera 290 from the external device 300 (step 332), and a radio wave signal representing the ID is transmitted from the antenna-containing substrate 1 (step 319). When the radio wave signal representing the ID that has been transmitted from the antenna-containing substrate 1 is received in the external equipment 300, the digital still camera 290 is recognized (step 333). Consequently, the ID and a radio wave signal for confirming a data transmitting state are transmitted to the digital still camera 290 from the external device 300 (step 334).

When the radio wave signal transmitted from the external device 300 is received in the antenna-containing substrate 1 in the digital still camera 290, the final image data and the imaging condition data that are stored in the memory 13 in the IC chip 6 are read, and are transmitted to the external device 300 (step 329). When the final image data and the imaging condition data that have been transmitted from the antenna-containing substrate in the digital still camera 290 are received in the external device 300 (step 335), the radio wave signal that has been transmitted from the external device 300 is stopped (step 336). Consequently, the supply of the power to the antenna-containing substrate 1 is stopped (step 321).

The memory 13 in the IC chip 6 may store the respective remaining capacities of the power supply 292 and the memory card 295 in the digital still camera 290, and others.

Figure 22:
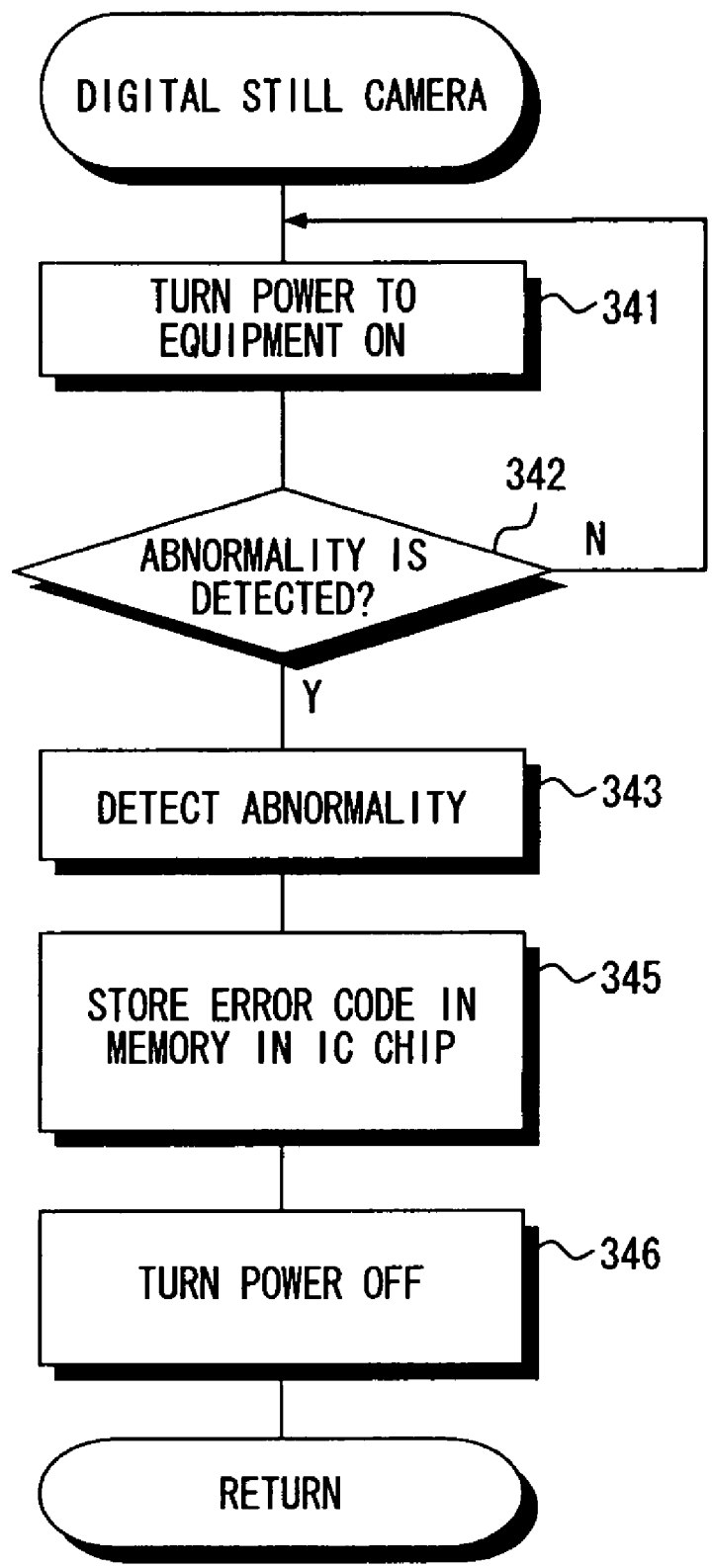
FIG. 22 is a flow chart showing the procedure for processing of a digital still camera.

FIG. 22 is a flow chart showing the procedure for processing of the digital still camera 290, showing a modified example. In the modified example, the digital still camera 290 also includes the above-mentioned antenna-containing substrate 1.

When the power to the digital still camera 290 is turned on (step 341), abnormality detection processing is performed (step 342). When an abnormality is detected (YES in step 343), an error code representing the contents of the abnormality is stored in the memory 13 within the IC chip 6 (step 345). Thereafter, the power is turned off (step 346).

When the radio wave signal is transmitted to the antenna-containing substrate 1 from the external device 300, and the power is supplied to the antenna-containing substrate 1, as described above, the error code stored in the memory 13 in the IC chip 6 is transmitted to the external device 300. The contents of the abnormality in the digital still camera 300 can be grasped without turning the power to the digital still camera 290 on. When the digital still camera 290 is in an abnormal state, therefore, the power to the digital still camera 290 is turned on, so that each of the circuits in the digital still camera 290 can be prevented from failing. Particularly, even when the power to the digital still camera 290 cannot be turned on by the abnormality in the digital still camera 290, the contents of the abnormality in the digital still camera 290 can be grasped by supplying the power to the IC chip 6.

Figure 23:
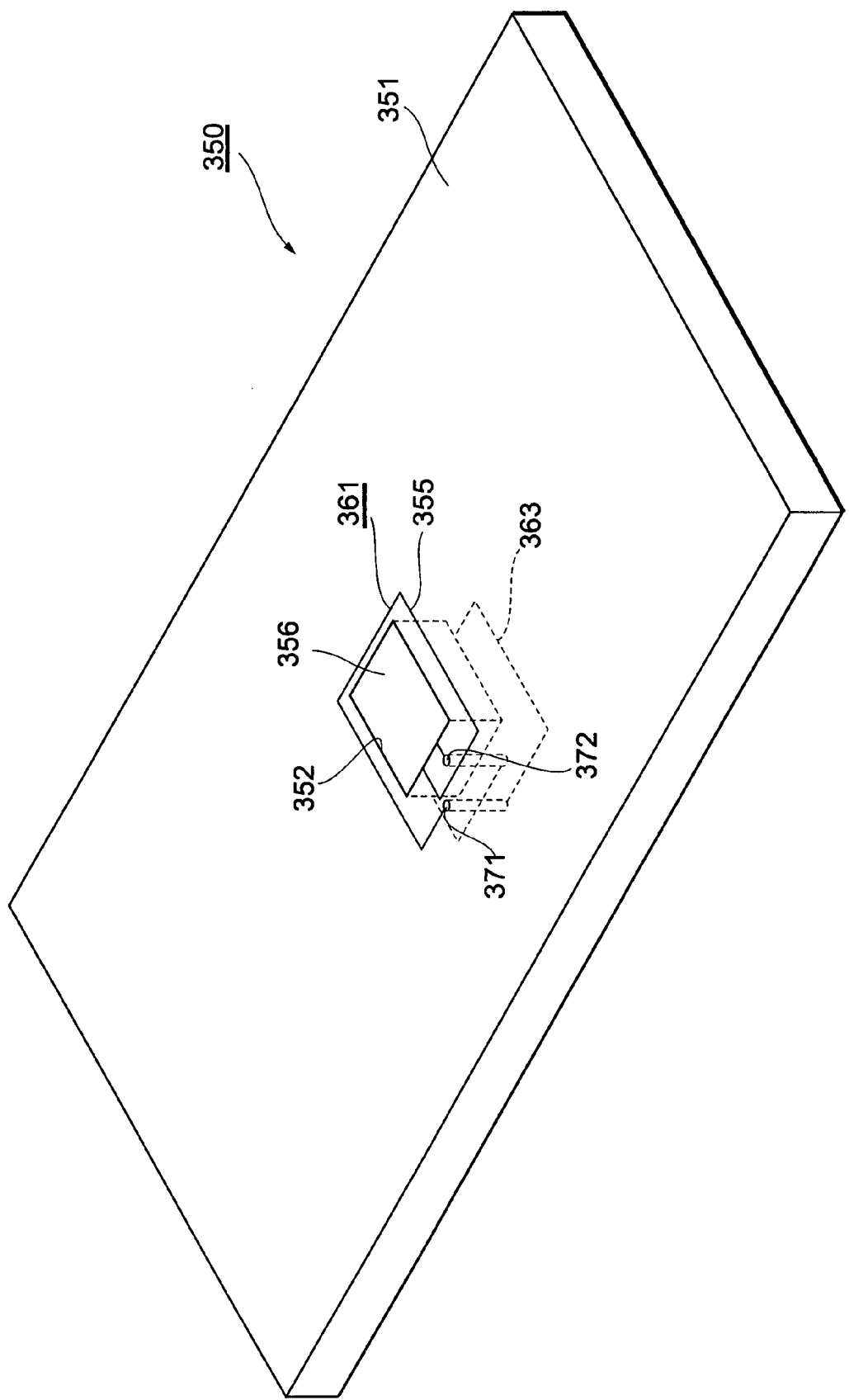
FIG. 23 is a perspective view of an antenna mounting substrate.
Figure 24A:
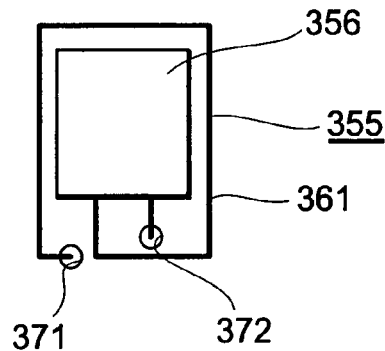
FIG. 24A illustrates a part of a top view of an antenna mounting substrate.
Figure 24B:
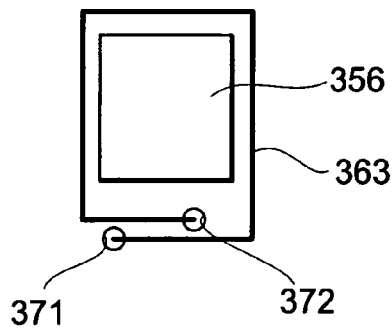
FIG. 24B illustrates a part of a bottom view of the antenna mounting substrate.
Figure 25:
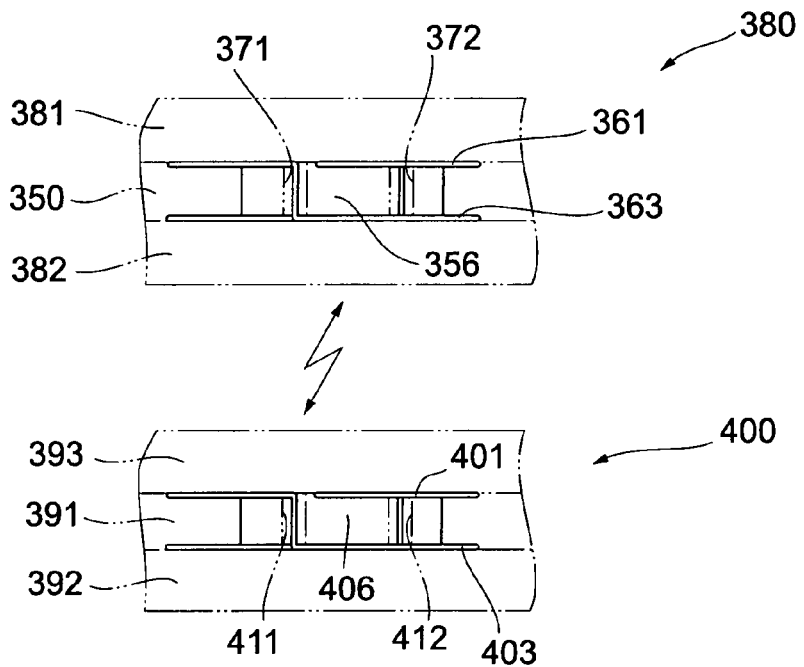
FIG. 25 shows how communication is established by means of the antenna-containing substrate device.

FIG. 23 to FIG. 25 illustrate still another embodiment.

FIG. 23 is a perspective view of an antenna mounting substrate. FIG. 24A is a part of a top view of the antenna mounting substrate, and FIG. 24B is a part of a bottom view of the antenna mounting substrate.

In an antenna mounting substrate 350 according to the present embodiment, an opening 352 is formed in a central portion of a substrate 351, and an IC chip 356 is fitted in the opening 352. An antenna 355 is connected to the IC chip 356.

The antenna 355 has a top antenna portion 361 having its one end connected to the IC chip 356 so as to enclose the IC chip 356 on an upper surface of the substrate 351. The substrate 351 is provided with two holes 371 and 372 passing through the substrate 351 from its upper surface to its lower surface ahead of the opening 352. The other end of the top antenna portion 361 is introduced into the lower surface of the substrate 351 through the one hole 371. A bottom antenna portion 363 is wired so as to enclose the IC chip 356 on the lower surface of the substrate 351. One end of the bottom antenna portion 363 is connected to the top antenna portion 361 through the one hole 371, as described above, and the other end thereof is introduced into the upper surface of the substrate 351 through the other hole 372 and is connected to the IC chip 356. Thus, the antenna 355 connected to the IC chip 356 has the top antenna portion 361 wired to the upper surface of the substrate 351 and the bottom antenna portion 363 wired to the lower surface of the substrate 351. Consequently, the transmission/receiving efficiency of a radio wave signal can be improved.

FIG. 25 shows how the radio wave signal is transmitted and received by means of the antenna mounting substrate shown in FIG. 23 and FIGS. 24A and 24B as viewed from the side. In FIG. 25, the same parts as those shown in FIG. 23 and FIGS. 24A and 24B are assigned the same reference numerals and hence, the description thereof is not repeated.

One antenna-containing substrate 380 includes an antenna mounting substrate 350, described above. A substrate 381 and a substrate 382 are respectively laminated and fixed on an upper surface and a lower surface of the antenna mounting substrate 350.

The other antenna-containing substrate 400 has an antenna mounting substrate 391, having the same configuration as that of the above-mentioned antenna mounting substrate 350, provided at its center. The antenna mounting substrate 391 includes an IC chip 406. A top antenna portion 401 and a bottom antenna portion 403 are respectively wired to an upper surface and a lower surface of the antenna mounting substrate 391. The top antenna portion 401 and the bottom antenna portion 403 are connected to each other by holes 411 and 412 passing through the substrate 391 from its upper surface to its lower surface. Further, a substrate 393 and a substrate 392 are respectively laminated and fixed on the upper surface and the lower surface of the antenna-containing substrate 391.

In such a way, the radio wave signal can be transmitted and received between the antenna-containing substrates 380 and 400.

Although in the above-mentioned embodiment, antennas are respectively wired to the upper surface and the lower surface of each of the substrates 350 and 391 at the center, antennas may be respectively wired to an upper surface and a lower surface of each of the antenna-containing substrates 380 and 400. A so-called quadruplex antenna wiring pattern can be formed, resulting in further improved transmission efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. An antenna-containing substrate wherein
a first substrate is provided with an IC chip and an antenna, wherein the antenna is mounted on a surface of the first substrate and is connected to the IC chip, and the first substrate and a second substrate are fixed and laminated such that a reverse surface of the second substrate is opposed to the surface of the first substrate, wherein the first substrate has an opening and the IC chip is fitted in the opening, and there is provided a wiring pattern for electrically connecting the IC chip to a component to be mounted on at least one of a reverse surface of the first substrate and a surface of the second substrate, the IC chip further comprising:

a power supply circuit that generates the power to be supplied to the IC chip on the basis of a radio wave signal received by the antenna, a data interface circuit that establishes data communication to and from the component to be mounted, a determination circuit that determines whether the power generated by the power supply circuit is supplied to the IC chip or the power applied through the wiring pattern is supplied to the IC chip, and a power supply control circuit that controls the supply of the power so as to continue to supply the power to the data interface circuit in response to the determination by the determination circuit that the power is supplied to the IC chip through the wiring pattern, while stopping supplying the power to the data interface circuit in response to the determination by the determination circuit that the power generated by the power supply circuit is supplied to the IC chip.

2. An operation member and antenna mounting substrate carrying device comprising:

an operation member mounting substrate having an operation member, which is operated by a touch of a human being, mounted on its surface, being provided with an IC chip connected to the operation member, and having a first antenna, connected to the IC chip, mounted on its surface or reverse surface; and a communication substrate having a second antenna, communicating with the first antenna mounted on the operation member mounting substrate, mounted thereon, wherein the communication substrate further comprises a determination circuit that determines whether or not it does not communicate with an external device excluding the operation member and antenna mounting substrate carrying device by means of the first antenna mounted on the operation member mounting substrate, and a communication control circuit that establishes communication through the first antenna mounted on the operation member mounting substrate by means of the second antenna in response to the determination by the determination circuit that it does not communicate with the external device, wherein a portion of the surface or reverse surface of the operation member mounting substrate corresponding to a portion having the first antenna mounted thereon is electromagnetically shielded.

3. The operation member and antenna mounting substrate carrying device according to claim 2, wherein the operation member mounting substrate is fixed to a case of the operation member and antenna mounting substrate carrying device on which the operation member mounting substrate is mounted with the substrate positioned inside the case and the operation member positioned so as to be exposed to the outside of the case.

4. The operation member and antenna mounting substrate carrying device according to claim 3, wherein the operation member mounting substrate is integrated with the case by being molded thereto.

5. The operation member and antenna mounting substrate carrying device according to claim 2, wherein the operation member mounting substrate is a flexible substrate.

6. The operation member and antenna mounting substrate carrying device according to claim 2, further comprising a transmission control circuit that transmits a radio wave signal for generating the power from the second antenna mounted on the communication substrate to the first antenna mounted on the operation member mounting substrate, the IC chip provided in the operation member mounting substrate further comprising a power supply circuit that generates the power on the basis of the radio wave signal received in the first antenna, a detection circuit that detects an operating state in the operation member on the basis of the power generated by the power supply circuit, and a transmission control circuit that transmits a signal representing the operating state detected by the detection circuit from the first antenna to the second antenna mounted on the communication substrate by means of the first antenna.

7. The operation member and antenna mounting substrate carrying device according to claim 2, wherein the operation member mounting substrate further comprises a receiving control circuit that carries out control such that the first antenna mounted on the operation member mounting substrate receives data transmitted from the external device excluding the operation member and antenna mounting substrate carrying device, and a memory circuit that stores the data received in the receiving control circuit.

8. The operation member and antenna mounting substrate carrying device according to claim 2, wherein the communication substrate further comprises a receiving control circuit that carries out control such that the second antenna mounted on the communication substrate receives the data transmitted from the external device excluding the operation member and antenna mounting substrate carrying device, and a memory circuit that stores the data received in the receiving control circuit.

* * * * *